US006891775B2

(12) United States Patent
Takeuchi

(10) Patent No.: US 6,891,775 B2
(45) Date of Patent: May 10, 2005

(54) ASYNCHRONOUS PSEUDO SRAM

(75) Inventor: Yoshiaki Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/762,540

(22) Filed: Jan. 23, 2004

(65) Prior Publication Data

US 2005/0068843 A1 Mar. 31, 2005

(30) Foreign Application Priority Data

Sep. 29, 2003 (JP) ........................................ 2003-338528

(51) Int. Cl.[7] .............................................. G11C 8/00
(52) U.S. Cl. ................................ 365/233.5; 365/230.08
(58) Field of Search ......................... 365/233.5, 189.01, 365/230.06, 230.08, 189.05, 196

(56) References Cited

U.S. PATENT DOCUMENTS 5,258,952 A  * 11/1993  Coker et al. ................. 365/194

FOREIGN PATENT DOCUMENTS

| JP | 6-12617 | 2/1994 |
| JP | 7-70214 | 7/1995 |
| JP | 2002-269977 | 9/2002 |

* cited by examiner

Primary Examiner—Thong Q. Le
(74) Attorney, Agent, or Firm—Oblon, Spivak, McClelland, Maier & Neustadt, P.C.

(57) ABSTRACT

An ATD circuit for row access, an ATD circuit for column access, and a mode determination circuit which determines which of the row access mode and column access mode is being executed are arranged in a pseudo SRAM. A mode determination signal is automatically generated in the chip to control the internal circuits. Upon detecting column address transition after the start of the cycle and activation of the sense amplifier, the mode determination circuit determines that column access starts. Upon detecting transition of a row address or a predetermined mode address after consecutive transition of the column address, the mode determination circuit determines that the column access mode is ended.

16 Claims, 19 Drawing Sheets

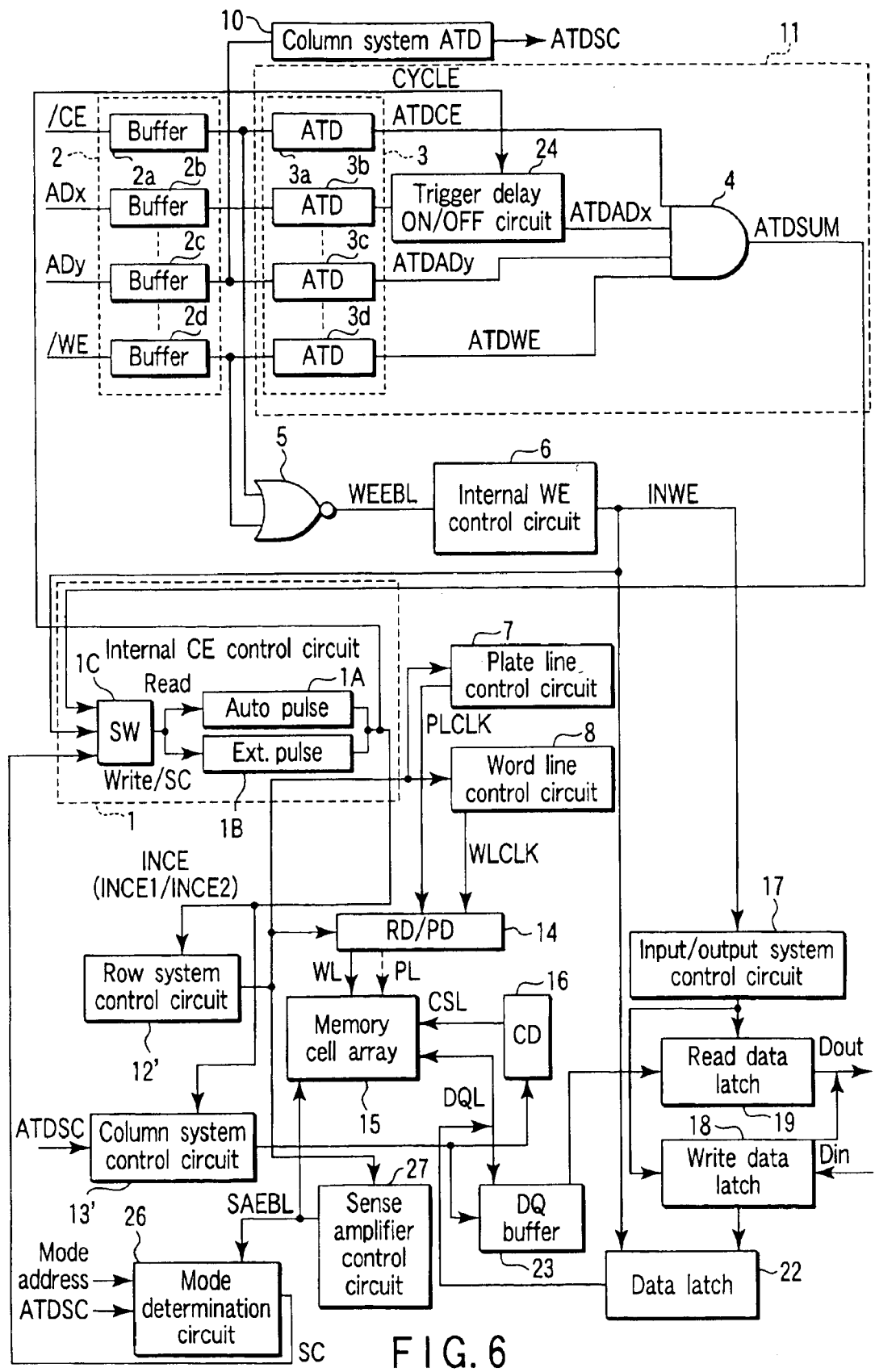
F I G. 6

Static column read

Static column write

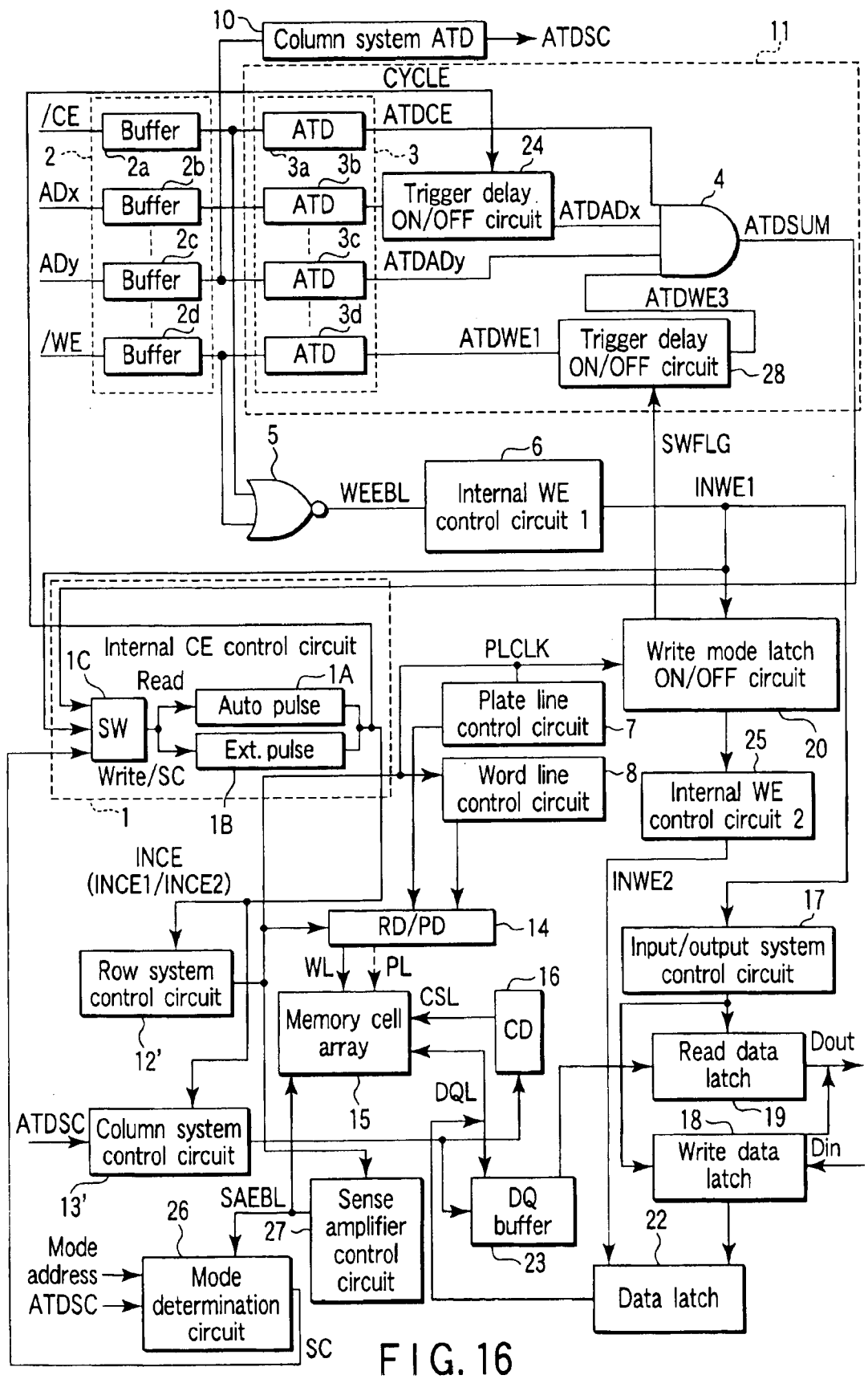
F I G. 16

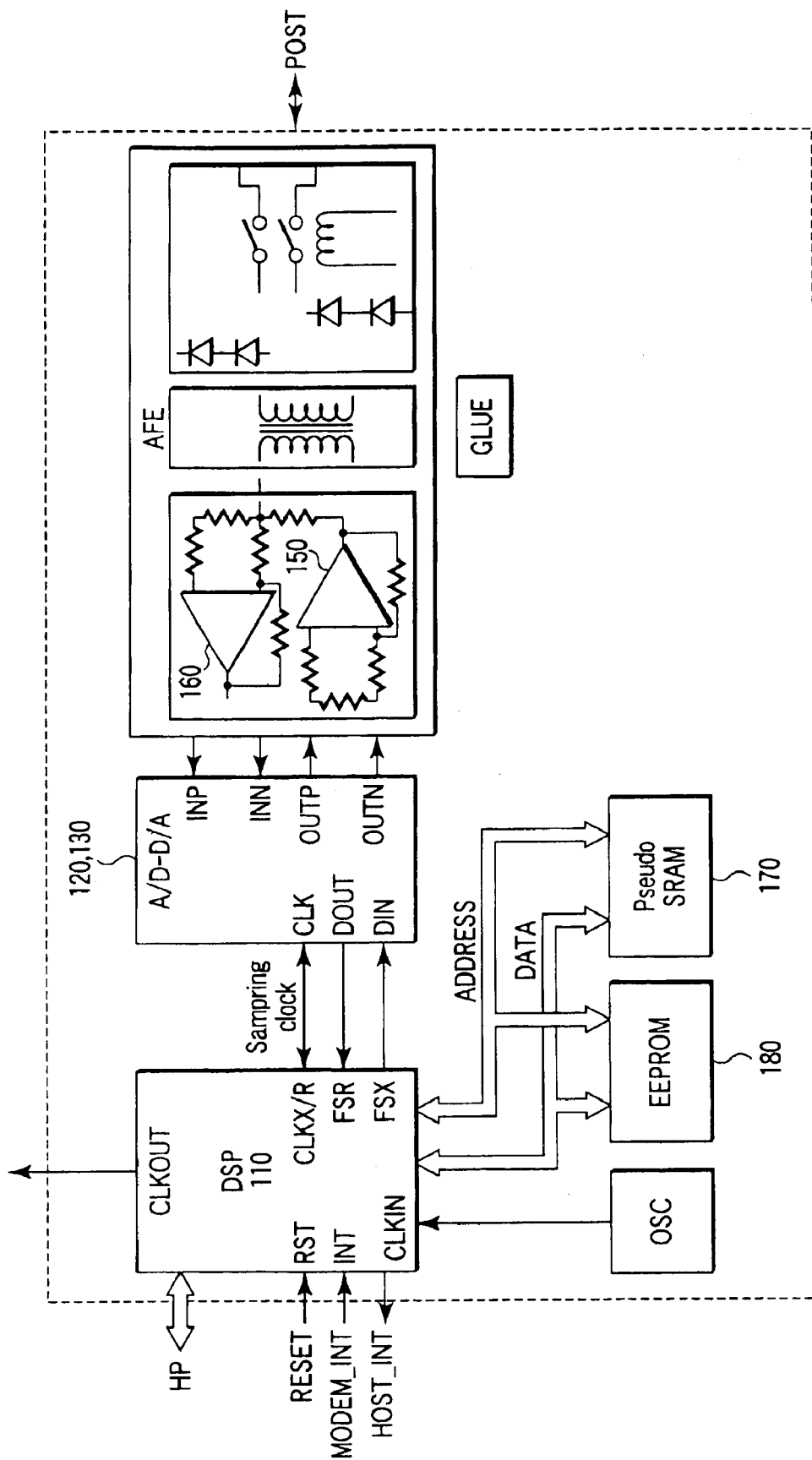
F I G. 22

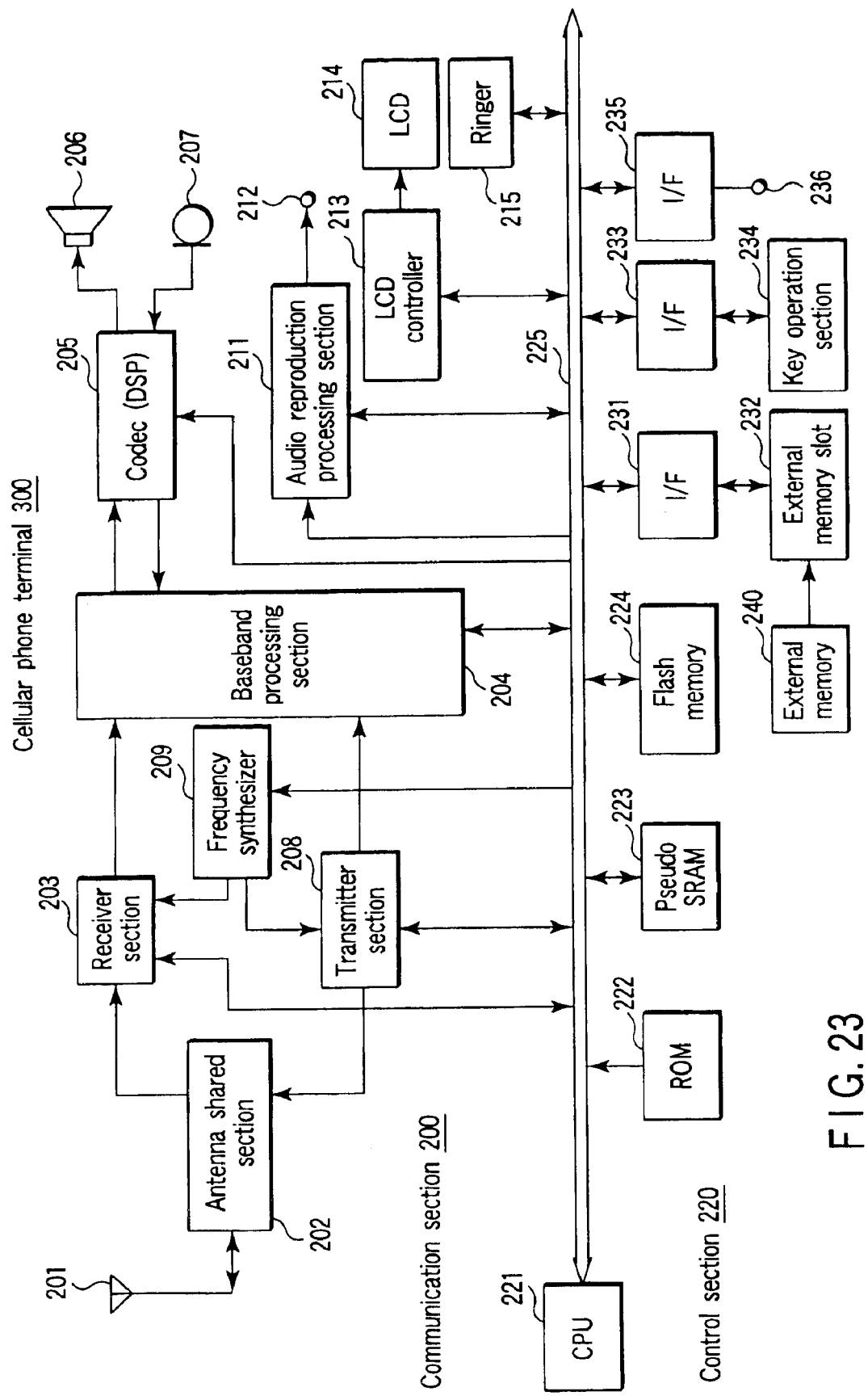
F I G. 23

ASYNCHRONOUS PSEUDO SRAM

CROSS-REFERENCE TO RELATED APPLICATIONS

This application is based upon and claims the benefit of priority from the prior Japanese Patent Application No. 2003-338528, filed Sep. 29, 2003, the entire contents of which are incorporated herein by reference.

BACKGROUND OF THE INVENTION

1. Field of the Invention

The present invention relates to a semiconductor integrated circuit device and, more particularly, to an asynchronous pseudo SRAM which uses a DRAM (Dynamic Random Access Memory) or ferroelectric memory in the memory core portion.

2. Description of the Related Art

Pseudo SRAMs are commercially available, which use a DRAM or ferroelectric memory in the memory core portion to increase the degree of integration while maintaining use compatibility to existing SRAMs. The mainstream of conventional pseudo SRAMs is a synchronous type which controls the operations of internal circuits by a clock signal (internal circuit control signal) time-serially generated in the device from an external input signal, e.g., an external chip enable signal /CE, as shown in FIGS. 1A and 1B.

In recent years, a demand for pseudo SRAMs oriented for cellular phones is increasing. Especially, a demand for asynchronous pseudo SRAMs which operate even asynchronously to an external input signal is growing.

To implement an asynchronous pseudo SRAM, an operation as shown in the timing charts of FIGS. 2A and 2B is necessary. FIG. 2A shows a read operation. FIG. 2B shows a write operation. To realize the read and write operations shown in FIGS. 2A and 2B, for example, an arrangement shown in FIG. 3 can be used. More specifically, a plurality of address transition detection circuits (row/column system ATDs 100) which detect address transition are prepared. A row address signal ADx output from a row address buffer circuit 101 and a column address signal ADy output from a column address buffer circuit 102 are supplied to the row/column system ATD 100, thereby detecting the transition of row and column addresses. On the basis of an AND signal ATDSUM of the detection result by the row/column system ATD 100, an internal CE control circuit 103 generates an internal chip enable signal (internal circuit control signal) INCE to control the internal circuits. The internal chip enable signal INCE is supplied to a row system circuit 104 and column system circuit 105. Signals that time-serially drive a word line WL and plate line PL in a memory cell array 106 are generated to control the data read and write (Dout and Din) operations.

In this arrangement, the cycle time defined by the external input signals (external chip enable signal /CE and address signals ADx and ADy) can freely be set. However, the internal chip enable signal INCE used to control the operations of the internal circuits has a predetermined cycle time because the signal is generated by using a timeout circuit (with constant time).

A proposal has been made in which the above-described restriction on the write operation should be eliminated by executing read and write operations as shown in the timing charts of FIGS. 4A and 4B. More specifically, in the read operation, the internal chip enable signal INCE (auto pulse) is generated by using a timeout circuit, as shown in FIG. 4A. In the write operation, the operations of the internal circuits are controlled by an external write enable signal /WE, as shown in FIG. 4B, without using any timeout circuit.

Additionally, asynchronous pseudo SRAMs often have a high-speed operation mode such as a static column mode in which the memory cells of a row selected by a row address are sequentially accessed by a column address signal, as shown in FIG. 1B.

However, the conventional pseudo SRAM cannot execute the high-speed operation mode such as a static column mode while operating asynchronously to an external input signal. This is because an asynchronous pseudo SRAM cannot discriminate between row access that is triggered by the transition of row and column addresses and column access that is also triggered by the transition of a column address. In addition, since the asynchronous pseudo SRAM controls the operations of the internal circuits by using a timeout circuit, the cycle time of the internal circuits is constant. That is, the arrangement is not compatible to a special operation mode.

Hence, there is a demand for implementation of a semiconductor integrated circuit device which can operate a pseudo SRAM asynchronously to an external input signal and also asynchronously execute a high-speed operation mode.

To meet this demand, for example, Jpn. Pat. Appln. KOKAI Publication No. 2002-269977 discloses the following arrangement. Two ATDs for row access and column access are prepared. In addition, a mode determination circuit is arranged, which generates an internal circuit control signal having a desired length necessary for access on the basis of the ATDs and determines two modes. The mode is automatically determined on the basis of the interval of address transition.

In the arrangement disclosed in this prior art, however, the address transition interval detection time must be set within a predetermined range. The cycle time of the column access mode cannot freely be set.

BRIEF SUMMARY OF THE INVENTION

According to an aspect of the present invention, there is provided a semiconductor integrated circuit device comprising a memory cell array, a chip enable transition detection circuit which detects transition of a chip enable signal that indicates a start of an operation of the memory cell array, a first address transition detection circuit which detects transition of a row address signal that indicates a row address of the memory cell array and transition of a column address signal that indicates a column address, a write enable transition detection circuit which detects transition of a write enable signal that indicates a write operation of the memory cell array, a first control circuit comprising a timeout circuit which generates a control signal that controls row access of the memory cell array on the basis of detection results of the chip enable transition detection circuit, the first address transition detection circuit, and the write enable transition detection circuit, a second address transition detection circuit which detects only the transition of the column address signal, a second control circuit which controls column access of the memory cell array on the basis of a detection result of the second address transition detection circuit, and a mode determination circuit which determines a start of a mode in which column access is executed and generates a mode determination signal when a condition that allows a start of a column access operation of the memory cell array is satisfied, and the second address transition detection circuit detects the transition of the column address, or determines an end of column access and sets a standby state when column access starts, and transition of a predetermined address or a row address is detected, wherein when the mode determination circuit determines row access, the access operation of the memory cell array is controlled by the timeout circuit in the first control circuit in read and write operations for the memory cell array, and when the mode determination circuit determines column access, an active operation is continued while stopping control by the timeout circuit until column access is ended in the read and write operations for the memory cell array.

According to another aspect of the present invention, there is provided a semiconductor integrated circuit device comprising a memory cell array, a chip enable transition detection circuit which detects transition of a chip enable signal that indicates a start of an operation of the memory cell array, a first address transition detection circuit which detects transition of a row address signal that indicates a row address of the memory cell array and transition of a column address signal that indicates a column address, a write enable transition detection circuit which detects transition of a write enable signal that indicates a write operation of the memory cell array, a first control circuit comprising a timeout circuit which generates a control signal that controls row access of the memory cell array on the basis of detection results of the chip enable transition detection circuit, the first address transition detection circuit, and the write enable transition detection circuit, a second address transition detection circuit which detects only the transition of the column address signal, a second control circuit which controls column access of the memory cell array on the basis of a detection result of the second address transition detection circuit, and a mode determination circuit which determines a start of a mode in which column access is executed and generates a mode determination signal when a condition that allows a start of a column access operation of the memory cell array is satisfied, and the second address transition detection circuit detects the transition of the column address, or determines an end of column access and sets a standby state when column access starts, and transition of a predetermined address or a row address is detected, wherein when the mode determination circuit determines row access, the access operation of the memory cell array is controlled by the timeout circuit in the first control circuit in read and write operations for the memory cell array, in the write operation for the memory cell array, when the write enable transition detection circuit detects the transition of an end of the write enable signal before a period indicated by the timeout circuit, the access operation of the memory cell array is controlled by the timeout circuit, in the write operation for the memory cell array, when the write enable transition detection circuit detects the transition of the end of the write enable signal after the period indicated by the timeout circuit, the access operation of the memory cell array is controlled in response to the transition of the write enable signal, when the mode determination circuit determines column access, an active operation is continued while stopping control by the timeout circuit until column access is ended in the read operation for the memory cell array, and in the write operation for the memory cell array, the active operation is continued while stopping control by the timeout circuit or control that responds to the transition of the write enable signal until column access is ended.

BRIEF DESCRIPTION OF THE SEVERAL VIEWS OF THE DRAWING

FIG. 6 is a block diagram showing the detailed arrangement of the main part of the circuits shown in FIG. 5 and details of peripheral circuits;

FIG. 16 is a block diagram showing the detailed arrangement of a main part related to the read and write of a pseudo SRAM so as to explain a semiconductor integrated circuit device according to the second embodiment of the present invention;

FIG. 22 is a block diagram showing the DSL (Digital Subscriber Line) data path portion of a DSL modem so as to explain Application Example 1 of the semiconductor integrated circuit devices (pseudo SRAMs) according to the first to fourth embodiments of the present invention;

FIG. 23 is a block diagram showing a cellular phone terminal so as to explain Application Example 2 of the semiconductor integrated circuit devices (pseudo SRAMs) according to the first to fourth embodiments of the present invention.

DETAILED DESCRIPTION OF THE INVENTION

[First Embodiment]

Figure 1A:
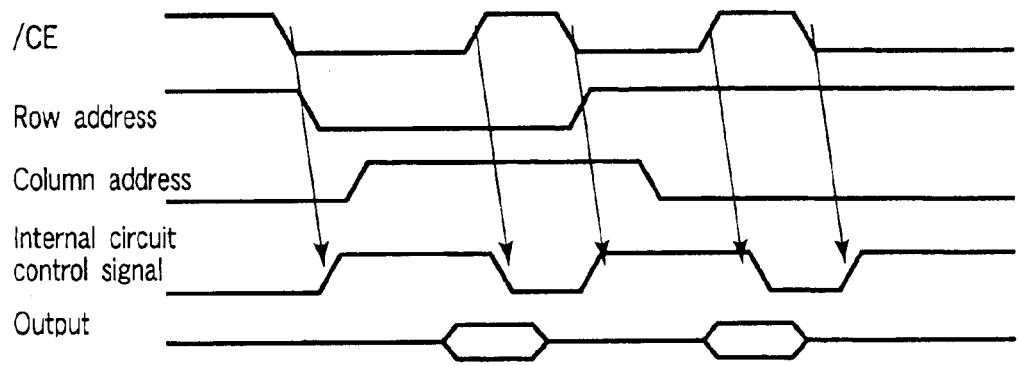
FIG. 1A is a timing chart showing the normal read operation of a synchronous pseudo SRAM so as to explain a conventional semiconductor integrated circuit device.
Figure 1B:
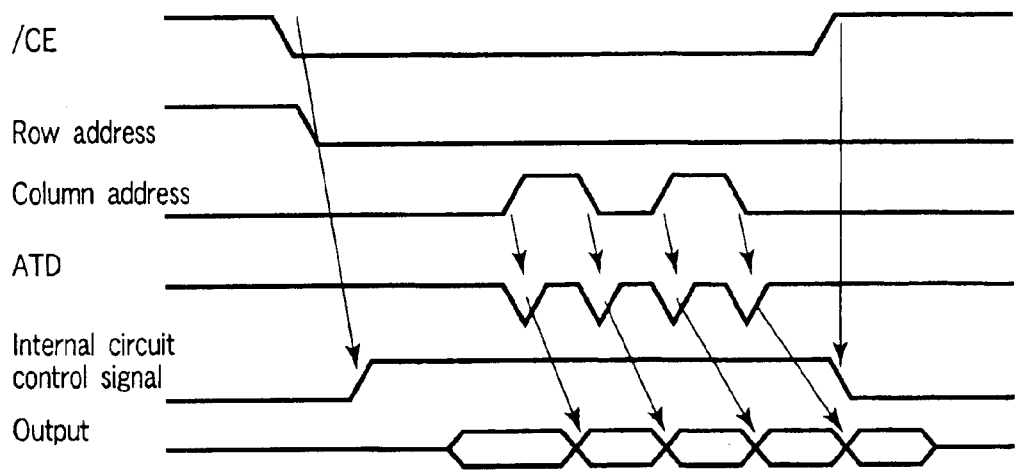
FIG. 1B is a timing chart showing the static column read operation of the synchronous pseudo SRAM so as to explain the conventional semiconductor integrated circuit device.
Figure 2A:
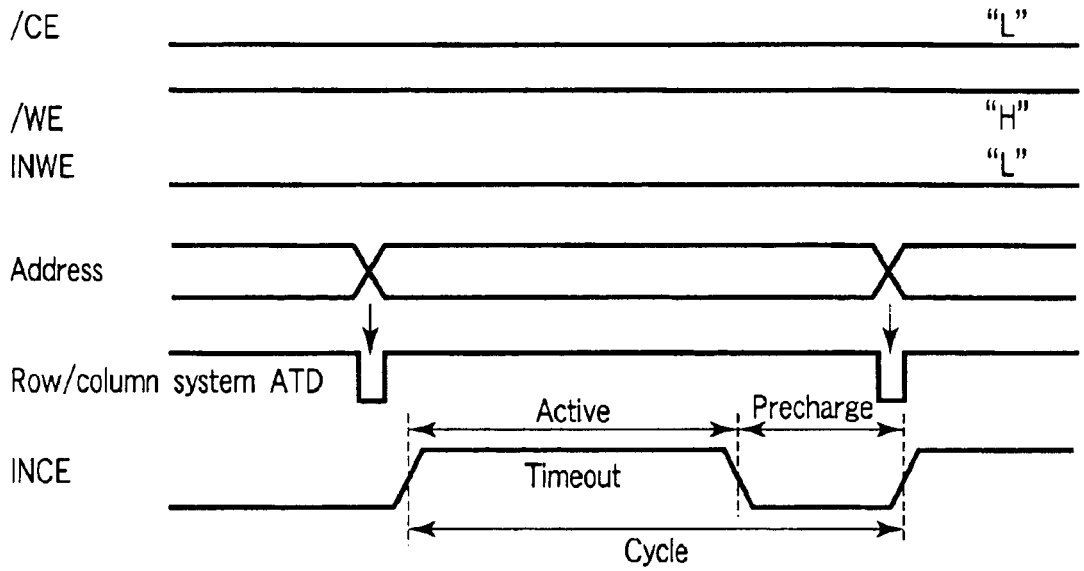
FIG. 2A is a timing chart of a semiconductor integrated circuit device which uses a timeout circuit for both the read and write operations, which shows the read operation of an asynchronous pseudo SRAM so as to explain a conventional semiconductor integrated circuit device.
Figure 2B:
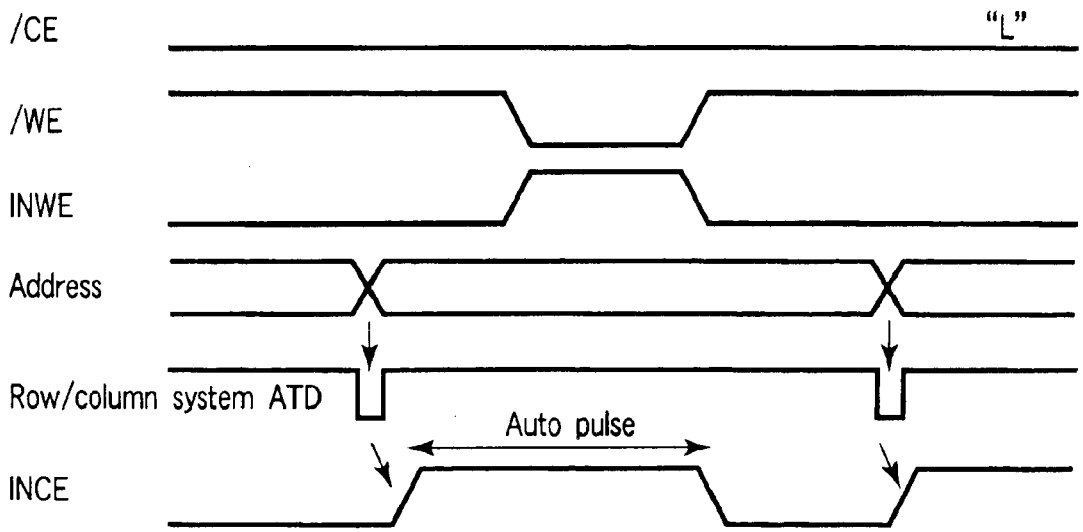
FIG. 2B is a timing chart of the semiconductor integrated circuit device which uses a timeout circuit for both the read and write operations, which shows the write operation of the asynchronous pseudo SRAM so as to explain the conventional semiconductor integrated circuit device.
Figure 3:
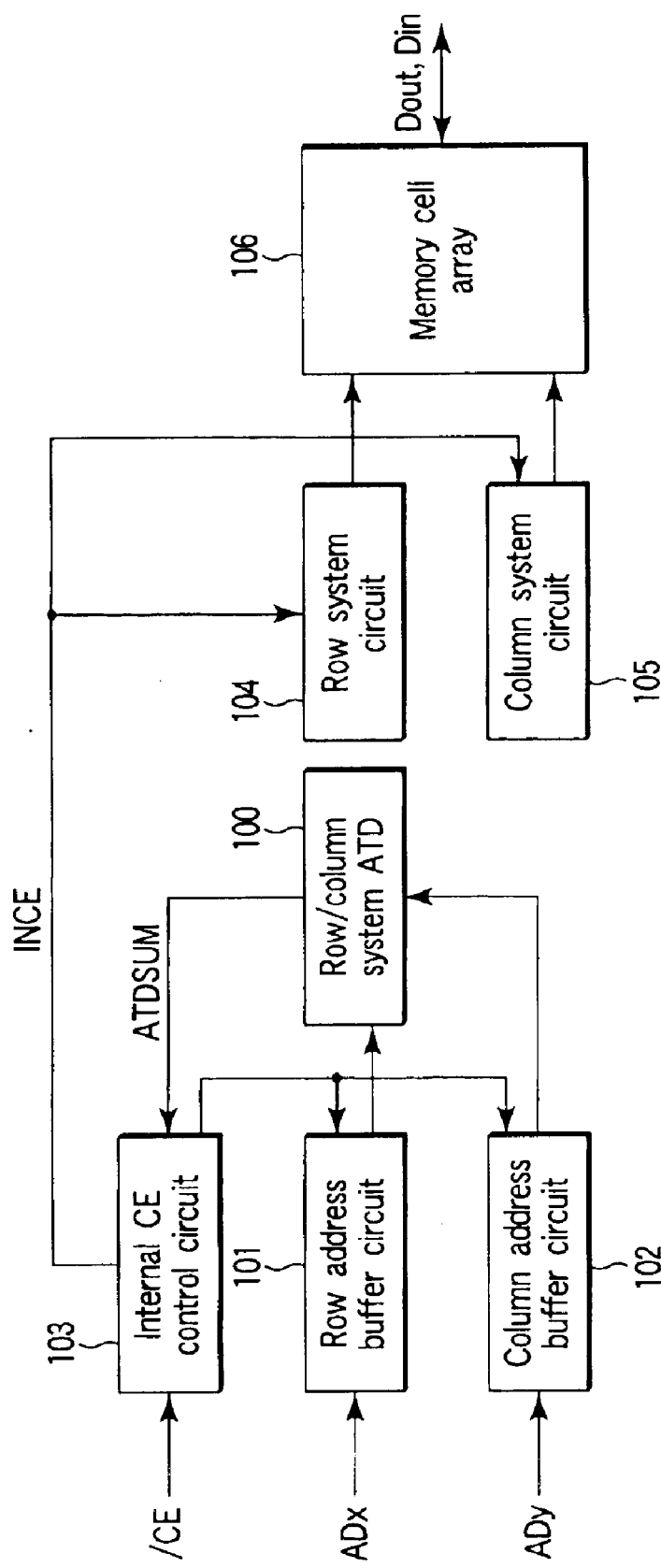
FIG. 3 is a block diagram showing a circuit section related to the read and write in the asynchronous pseudo SRAM incorporated in the semiconductor integrated circuit device so as to explain the conventional semiconductor integrated circuit device.
Figure 4A:
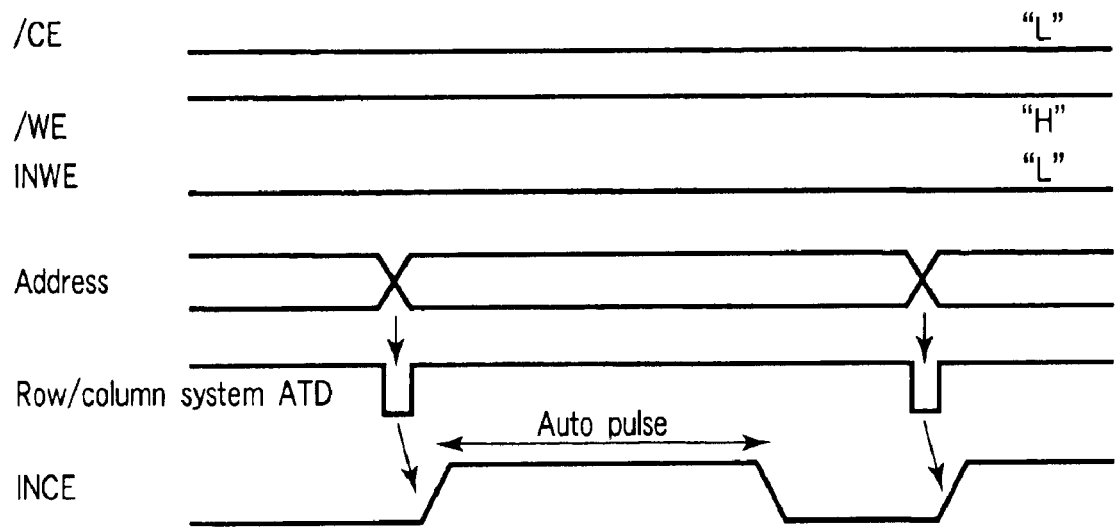
FIG. 4A is a timing chart of a semiconductor integrated circuit device which uses a timeout circuit for only the read operation and controls the write operation on the basis of an external WE signal, which shows the read operation of an asynchronous pseudo SRAM so as to explain a conventional semiconductor integrated circuit device.
Figure 4B:
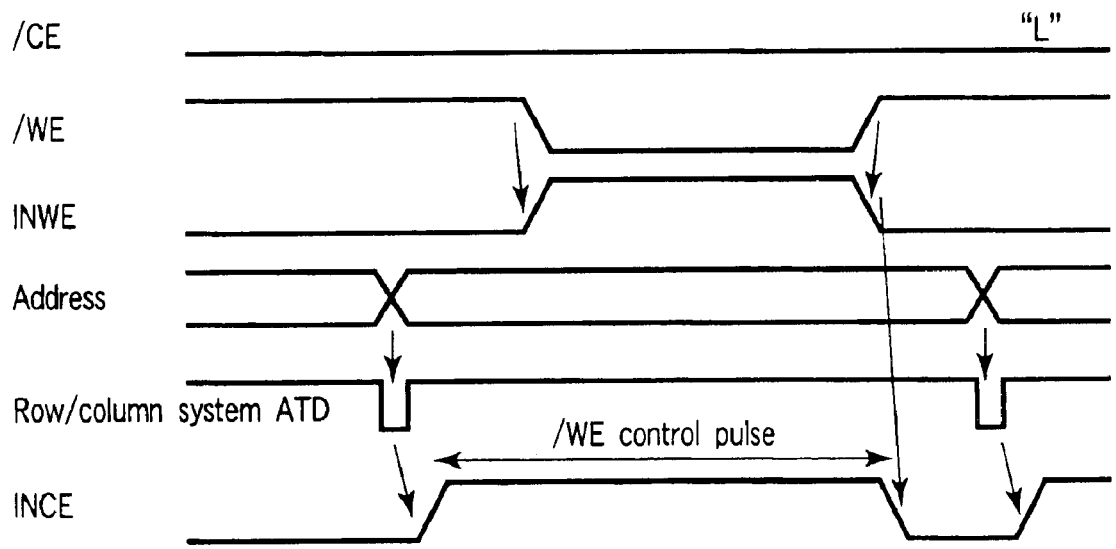
FIG. 4B is a timing chart of the semiconductor integrated circuit device which uses a timeout circuit for only the read operation and controls the write operation on the basis of an external WE signal, which shows the write operation of the asynchronous pseudo SRAM so as to explain the conventional semiconductor integrated circuit device.
Figure 5:
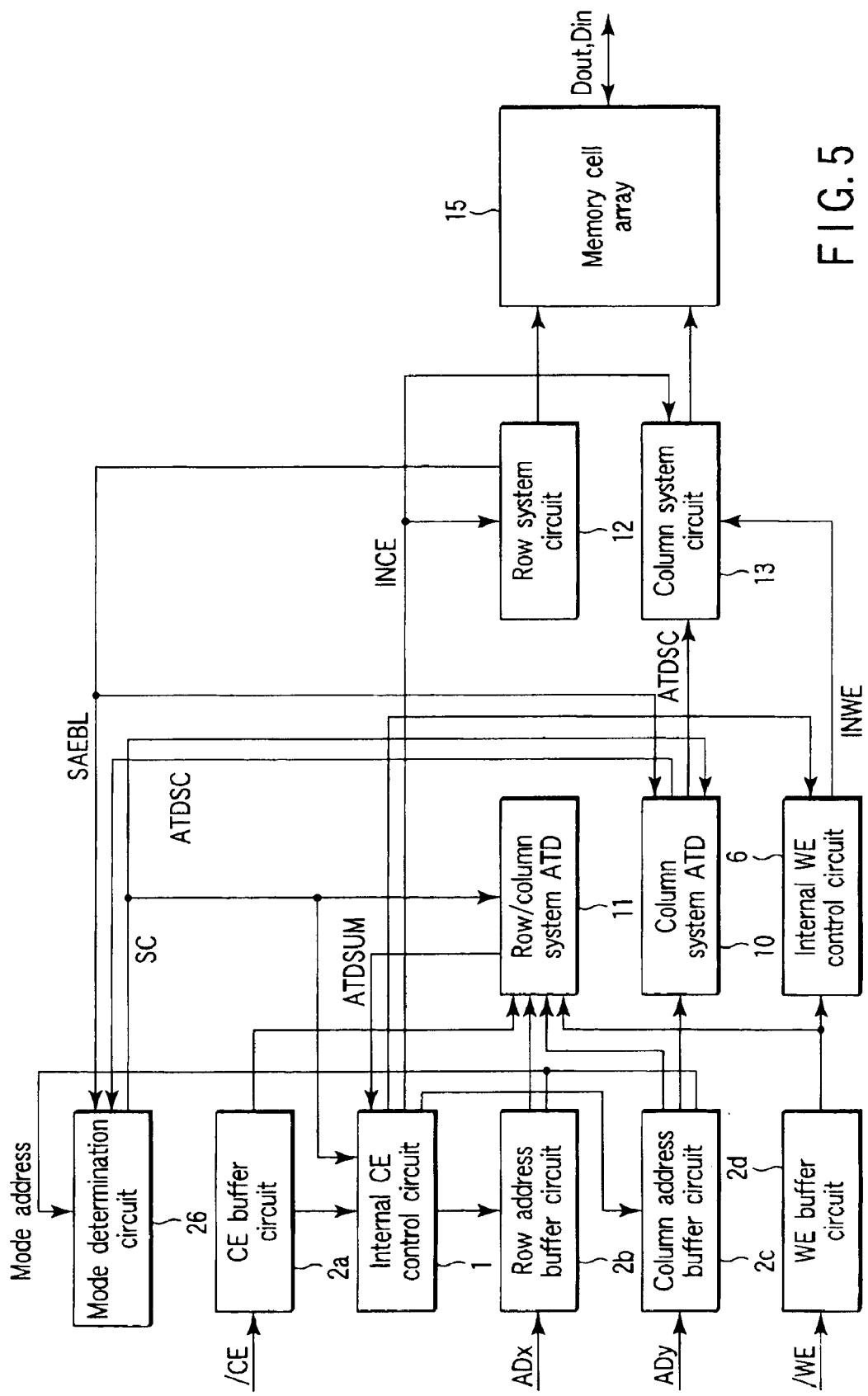
FIG. 5 is a schematic block diagram showing circuits related to the read and write of a pseudo SRAM incorporated in a semiconductor integrated circuit device so as to explain a semiconductor integrated circuit device according to the first embodiment of the present invention.

FIG. 5 is a schematic block diagram showing circuits related to the read and write of a pseudo SRAM incorporated in a semiconductor integrated circuit device so as to explain a semiconductor integrated circuit device according to the first embodiment of the present invention. The pseudo SRAM comprises an internal CE control circuit 1, CE buffer circuit 2a, row address buffer circuit 2b, column address buffer circuit 2c, WE buffer circuit 2d, internal WE control circuit 6, column system ATD 10, row/column system ATD 11, row system circuit 12, column system circuit 13, memory cell array 15, and mode determination circuit 26.

An external chip enable signal /CE is input to the CE buffer circuit 2a. A row address signal ADx is input to the row address buffer circuit 2b. A column address signal ADy is input to the column address buffer circuit 2c. An external write enable signal /WE is input to the WE buffer circuit 2d. Output signals from the buffer circuits 2a to 2d are supplied to the row/column system ATD 11. An output signal from the buffer circuit 2c is supplied to the column system ATD 10. The column system ATD 10 detects the transition of the column address signal ADy and generates a detection signal (ATD signal) ATDSC necessary for the operation of the column system circuit 13. The output signal from the buffer circuit 2d is supplied to the internal WE control circuit 6.

A mode determination signal SC output from the mode determination circuit 26 is supplied to the row/column system ATD 11. A row/column system detection signal (ATD signal) ATDSUM is supplied to the internal CE control circuit 1. An output signal from the CE buffer circuit 2a and the mode determination signal SC output from the mode determination circuit 26 are supplied to the internal CE control circuit 1. The internal CE control circuit 1 generates an internal chip enable signal INCE to control the operation of the row system circuit 12 and column system circuit 13 and also control the row address buffer circuit 2b, column address buffer circuit 2c, and internal WE control circuit 6.

A mode address (row address) is supplied from the buffer circuits 2b and 2c to the mode determination circuit 26. A sense amplifier enable signal SAEBL from the row system circuit 12 and the ATD signal ATDSC from the column system ATD 10 are also supplied to the mode determination circuit 26. The mode determination circuit 26 determines on the basis of these signals which of row access and column access should be executed and generates the mode determination signal SC.

The sense amplifier enable signal SAEBL output from the row system circuit 12 and the mode determination signal SC output from the mode determination circuit 26 are supplied to the column system ATD 10. The column system ATD 10 supplies the ATD signal ATDSC of a column address to the column system circuit 13.

An output signal (internal write enable signal) INWE from the internal WE control circuit 6 is also supplied to the column system circuit 13.

The access operation to the memory cell array 15 is executed by the row system circuit 12 and column system circuit 13. Then, read data Dout is output from the memory cell array 15. Alternatively, write data Din is input to the memory cell array 15.

FIG. 6 is a block diagram showing the detailed arrangement of the main part of the circuits shown in FIG. 5 and details of peripheral circuits. The row/column system ATD 11 includes an ATD circuit 3, AND circuit 4, and trigger delay ON/OFF circuit 24. The ATD circuit 3 is constructed by ATDs 3a to 3d which receive the output signals from the buffer circuits 2a to 2d and detect the transition of these signals. Signals ATDCE, ATDADy, and ATDWE representing the detection results output from the ATDs 3a, 3c, and 3d are supplied to the input terminals of the AND circuit 4. A signal ATDADx representing the detection result output from the ATD 3b is supplied to the AND circuit 4 through the trigger delay ON/OFF circuit 24. A control signal CYCLE that is output from the internal CE control circuit 1 to define the cycle is supplied to the trigger delay ON/OFF circuit 24 to control it. The trigger delay ON/OFF circuit 24 is used to receive the transition trigger of the row address signal ADx not within the cycle but after the end of the cycle. The AND signal ATDSUM output from the AND circuit 4 is supplied to the internal CE control circuit 1.

The output signals from the buffer circuits 2a and 2d are supplied to the input terminals of a NOR circuit 5. The NOR circuit 5 supplies, to the internal WE control circuit 6, a signal WEEBL to start a write operation when both the external chip enable signal /CE and the external write enable signal /WE are at "L" level.

The internal CE control circuit 1 includes a switch (SW) 1C, a pulse generator (Auto pulse) 1A which serves as an internal timeout circuit and outputs a pulse having a predetermined width, and a pulse generator (Ext. pulse) 1B which outputs a pulse signal in response to the transition of the external write enable signal /WE in the write operation and in switching the mode. The AND signal ATDSUM output from the AND circuit 4, the internal write enable signal INWE output from the internal WE control circuit 6, and the mode determination signal SC output from the mode determination circuit 26 are supplied to the switch 1C. A signal selected by the switch 1C is supplied to the pulse generators 1A and 1B. The internal chip enable signals INCE (INCE1/ INCE2) output from the pulse generators 1A and 1B are supplied to a row system control circuit 12' and column system control circuit 13', respectively. The control signal CYCLE that defines the cycle is supplied to the trigger delay ON/OFF circuit 24.

The row system control circuit 12' controls the row system circuit 12 which includes a plate (PL) control circuit 7, word line (WL) control circuit 8, row decoder/plate decoder (RD/PD) 14, and sense amplifier control circuit 27.

The column system control circuit 13' controls the column system circuit 13 which includes a column decoder (CD) 16 and DQ buffer 23.

An output signal PLCLK from the plate control circuit 7 and an output signal WLCLK from the word line control circuit 8 are supplied to the row decoder/plate decoder 14. The row decoder/plate decoder 14 selects and drives a word line WL and plate line PL in the memory cell array 15. In addition, the sense amplifier in the memory cell array 15 is driven by the sense amplifier enable signal SAEBL output from the sense amplifier control circuit 27. Furthermore, a column select line CSL in the memory cell array 15 is selected by the column decoder 16.

The sense amplifier enable signal SAEBL output from the sense amplifier control circuit 27 is supplied to the mode determination circuit 26. The mode addresses output from the buffer circuits 2b and 2c and the ATD signal ATDSC of a column address, which is output from the column system ATD 10, are supplied to the mode determination circuit 26 so that it generates the mode determination signal SC to be supplied to the switch 1C.

The write data Din to a selected memory cell in the memory cell array 15 is latched by a write data latch 18, supplied to a data latch 22, and written through a data line DQL. The write data Din latched by the write data latch 18 can be output to the outside. On the other hand, data read out from a selected memory cell is supplied to the DQ buffer 23 through the data line DQL, supplied to and latched by a read data latch 19, and output as the readout data Dout.

The operations of the write data latch 18 and read data latch 19 are controlled by an input/output system control circuit 17. The input/output system control circuit 17 and data latch 22 are controlled by the internal write enable signal INWE output from the internal WE control circuit 6.

Figure 7A:
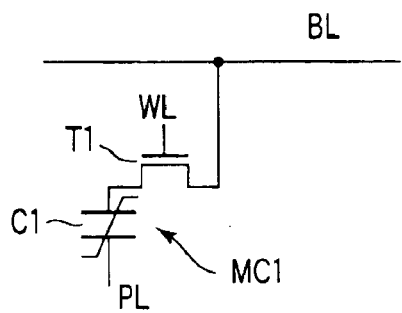
FIG. 7A is an equivalent circuit diagram showing a ferroelectric cell having a 1-transistor/1-capacitor structure so as to explain the structure of the memory cell array shown in FIG. 6.

Ferroelectric cells MC1 each having a 1-transistor/1-capacitor structure shown in FIG. 7A are arranged in a matrix in the memory cell array 15. In a cell capacitor C1 of the ferroelectric cell MC1, a ferroelectric material such as lead zirconate titanate ($PbZrTiO_3$: PZT) is used as a capacitor insulating film.

Figure 7B:
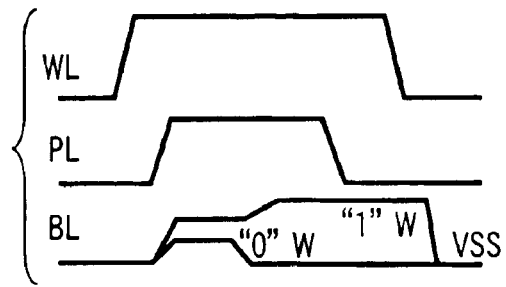
FIG. 7B is a timing chart showing the operation waveforms of the ferroelectric cell shown in FIG. 7A.

The structure and the data write, read, and rewrite operations of the ferroelectric cell MC1 will be briefly described with reference to FIGS. 7A, 7B, and B.

The data write operation for the ferroelectric cell MC1 is executed in the following manner. The word line WL is selected. In this state, the plate line PL is pulse-driven from the ground potential ("L" level) to a predetermined potential ("H" level) and then returned to "L" level. With this operation, data on a bit line BL can be written.

In the read operation for data stored in the ferroelectric cell MC1, the word line WL is selected. In this state, the plate line PL is pulse-driven from "L" level to "H" level. With this operation, charges can be read out to the bit line BL.

Figure 8:
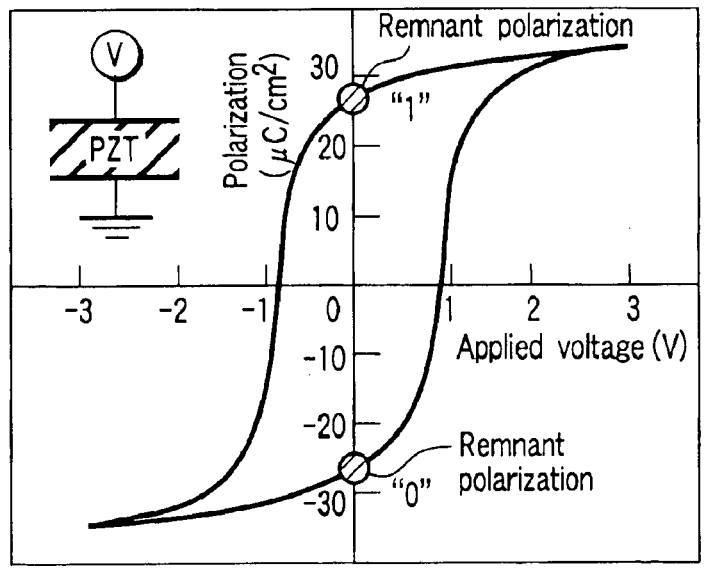
FIG. 8 is a graph showing the relationship (hysteresis characteristic) between the applied voltage and the remnant polarization of the ferroelectric cell shown in FIG. 7A.

More specifically, when no voltage is applied between the electrodes, the cell capacitor C1 of the ferroelectric cell MC1 shown in FIG. 7A has one of polarization states in two, upward and downward directions indicated by "0" and "1" in FIG. 8. That is, the ferroelectric cell MC1 is a nonvolatile memory. In this state, a voltage is applied. In the state "1", the polarization is not reversed. In the state "0", the polarization is reversed. The charge amount necessary for applying the same voltage, i.e., the charge amount generated in one electrode in accordance with the "0" or "1" storage state when the same voltage is applied to the other electrode changes between the two states. Stored data is read out by detecting the difference. The data read from such a ferroelectric memory is a destructive read. A rewrite operation must always be executed after the read operation.

The data rewrite operation for the ferroelectric cell MC1 shown in FIG. 7A will be described. For read data "0", the rewrite operation of the data "0" is executed when it is sense-amplified by the sense amplifier in the read mode, as shown in FIG. 7B. To the contrary, for read data "1", the plate line PL is returned from "H", level to "L" level, and the rewrite operation of the data "1" is then started.

The reason why mode determination of row access and column access by the mode determination circuit 26 is necessary in the pseudo SRAM shown in FIGS. 5 and 6 will be described next.

The row access (normal mode) operation and column access (static column mode) operation in the circuit shown in FIG. 5 do not change until word line selection. Then, the operation changes. In row access, a standby operation is performed a predetermined time after the internal chip enable signal INCE is generated on the basis of the row/column system ATD signal (ATDSUM). In column access, no standby state is set during the access period. Instead, a standby state is set upon detecting the end of access.

For this purpose, the internal CE control circuit 1 is constructed by using, e.g., a pulse generator shown in FIG.

9. The internal CE control circuit 1 includes inverters 30 to 33, delay circuit 34, and NAND circuits 35 and 36. The circuit 1 serves as a pulse generator which calculates the logic between the mode determination signal SC, the internal write enable signal INWE, and the pulse-shaped AND signal ATDSUM which is generated by using, as a trigger, the transition of one of the external chip enable signal /CE, external write enable signal /WE, and address signals ADx and ADy.

The AND signal ATDSUM output from the row/column system ATD 11 is supplied to the input terminal of the inverter 30. An output signal P1 from the inverter 30 is supplied to one input terminal of the NAND circuit 36 and the delay circuit 34. A delay signal P2 output from the delay circuit 34 is supplied to the first input terminal of the NAND circuit 35. The mode determination signal SC output from the mode determination circuit 26 is supplied to the input terminal of the inverter 31. An output signal P5 from the inverter 31 is supplied to the second input terminal of the NAND circuit 35. The internal write enable signal INWE output from the internal WE control circuit 6 is supplied to the input terminal of the inverter 32. An output signal P3 from the inverter 32 is supplied to the third input terminal of the NAND circuit 35. The output signal from the NAND circuit 35 is supplied to the input terminal of the inverter 33. An output signal P4 from the inverter 33 is supplied to the other input terminal of the NAND circuit 36. The internal chip enable signal INCE is output from the output terminal of the NAND circuit 36.

Figure 10A:
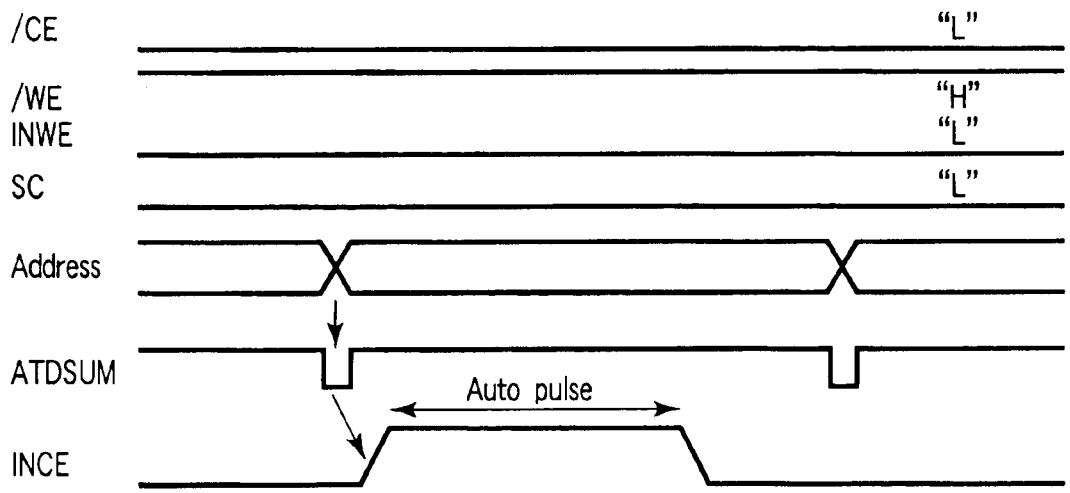
FIG. 10A is a timing chart showing a normal read operation so as to explain the read operation of the internal CE control circuit shown in FIG. 9.

The internal CE control circuit 1 executes the normal read operation as shown in the timing chart of FIG. 10A. When the row/column system ATD 11 detects the transition of the address signal, and the AND signal ATDSUM changes to "L" level, the output signal P1 from the inverter 30 changes to "H" level. The internal chip enable signal INCE output from the NAND circuit 36 changes to "H" level. The output signal P1 from the inverter 30 is delayed by the delay circuit 34 and supplied to the first input terminal of the NAND circuit 35. At this time, the mode determination signal SC output from the mode determination circuit 26 and the internal write enable signal INWE output from the internal WE control circuit 6 are always at "L" level. For this reason, the output signals P5 and P3 from the inverters 31 and 32 are at "H" level. After the elapse of a predetermined delay time, the output signal P2 from the delay circuit 34 changes from "L" level to "H" level. The output signal from the NAND circuit 35 changes to "L" level. The output signal P4 from the inverter 33 changes to "H" level. As a result, the internal chip enable signal INCE output from the NAND circuit 36 changes to "L" level.

That is, the internal CE control circuit 1 serves as a pulse generator which generates the auto pulse signal INCE that is set at "H" level during the period after the AND signal ATDSUM changes to "L" level until the delay time of the delay circuit 34.

Figure 10B:
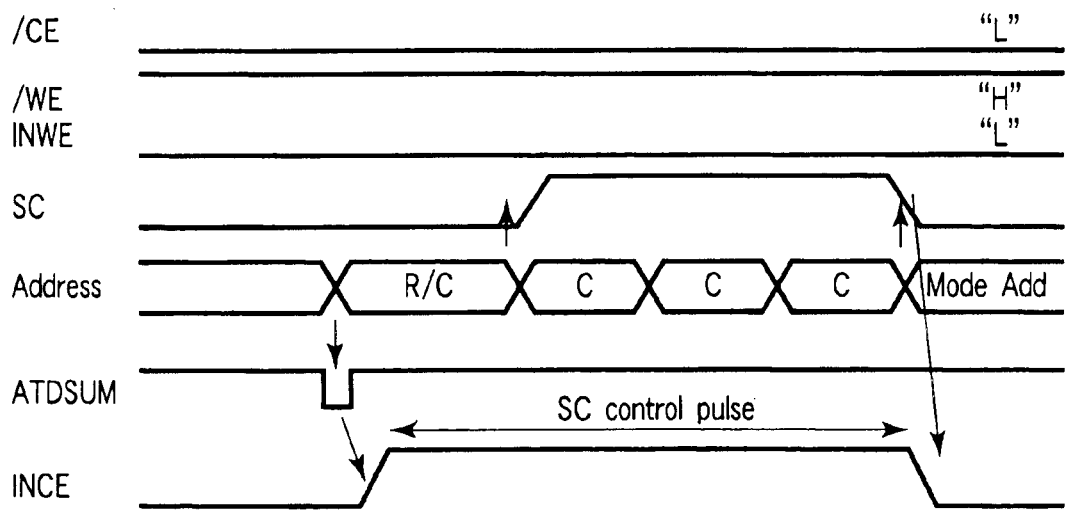
FIG. 10B is a timing chart showing a static column read operation so as to explain the read operation of the internal CE control circuit shown in FIG. 9.

To the contrary, in the static column read operation shown in FIG. 10B, when the AND signal ATDSUM output from the row/column system ATD 11 changes to "L" level upon detecting the address transition, the output signal P1 from the inverter 30 changes to "H" level. The internal chip enable signal INCE output from the NAND circuit 36 changes to "H" level. The output signal P1 from the inverter 30 is delayed by the delay circuit 34 and supplied to the first input terminal of the NAND circuit 35. During the period when the mode determination signal SC output from the mode determination circuit 26 and the internal write enable signal INWE output from the internal WE control circuit 6 are at "L" level, the output signals P5 and P3 from the inverters 31 and 32 are at "H" level. The output signal from the NAND circuit 35 changes to "L" level. The output signal P4 from the inverter 33 changes to "H" level. Hence, the internal chip enable signal INCE output from the NAND circuit 36 maintains "H" level.

The static column read operation starts. When the mode determination signal SC changes to "H" level within the delay time of the delay circuit 34, the output signal INCE from the internal CE control circuit 1 continuously maintains "H" level, independently of the delay time of the delay circuit 34, during the period until the mode determination signal SC changes to "L" level. Hence, the internal CE control circuit 1 serves as a pulse generator which generates a pulse signal (Ext. pulse) that maintains "H" level during the period after the AND signal ATDSUM changes to "L" level until the mode determination signal SC changes to "L" level.

Figure 9:
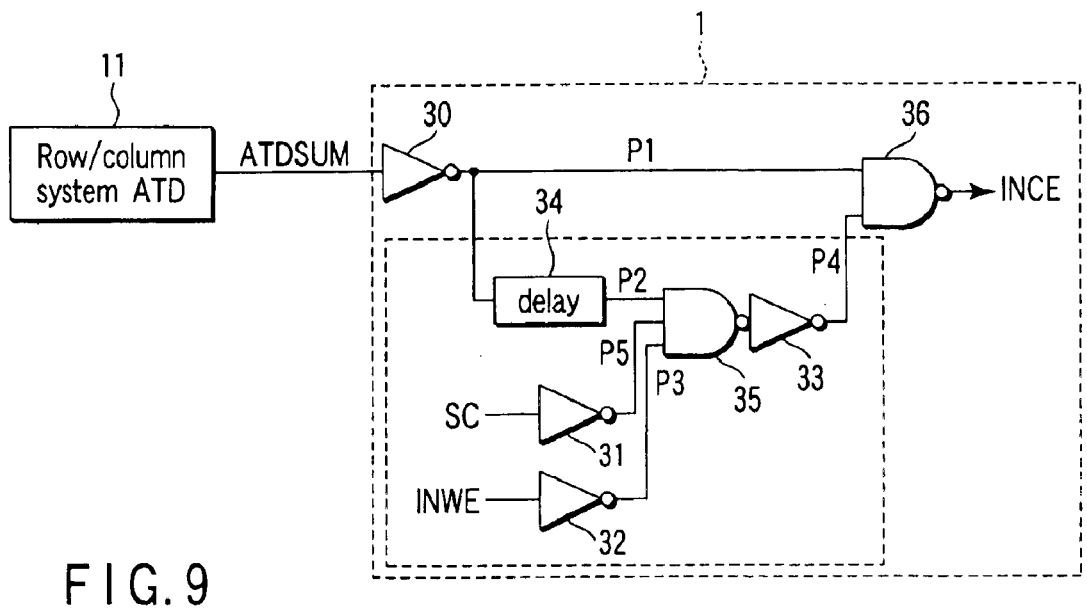
FIG. 9 is a circuit diagram showing the detailed arrangement of an internal CE control circuit so as to explain the operation of the semiconductor integrated circuit device shown in FIGS. 5, 6, and 7A.
Figure 11A:
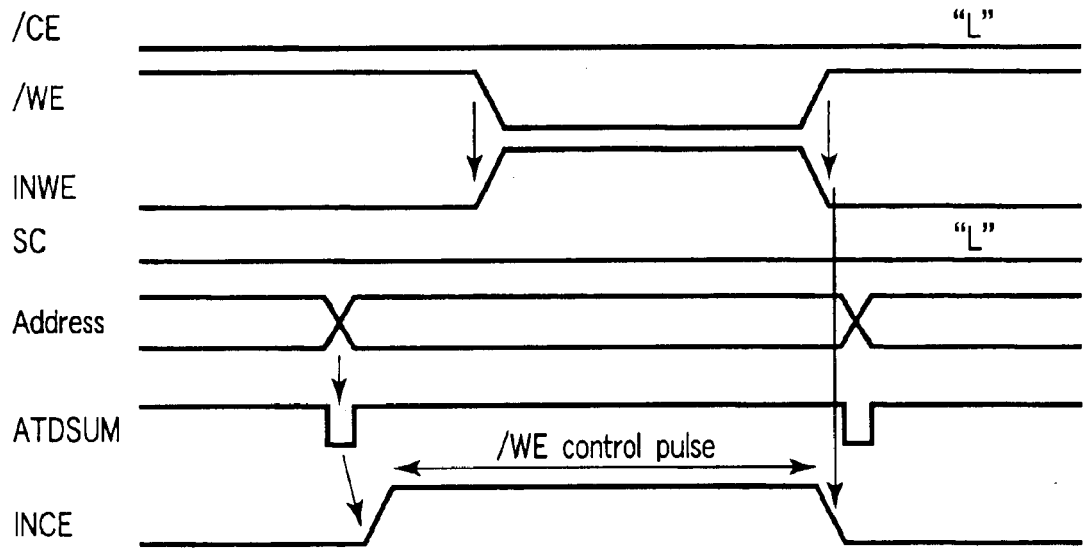
FIG. 11A is a timing chart showing a normal write operation so as to explain the write operation of the internal CE control circuit shown in FIG. 9.
Figure 11B:
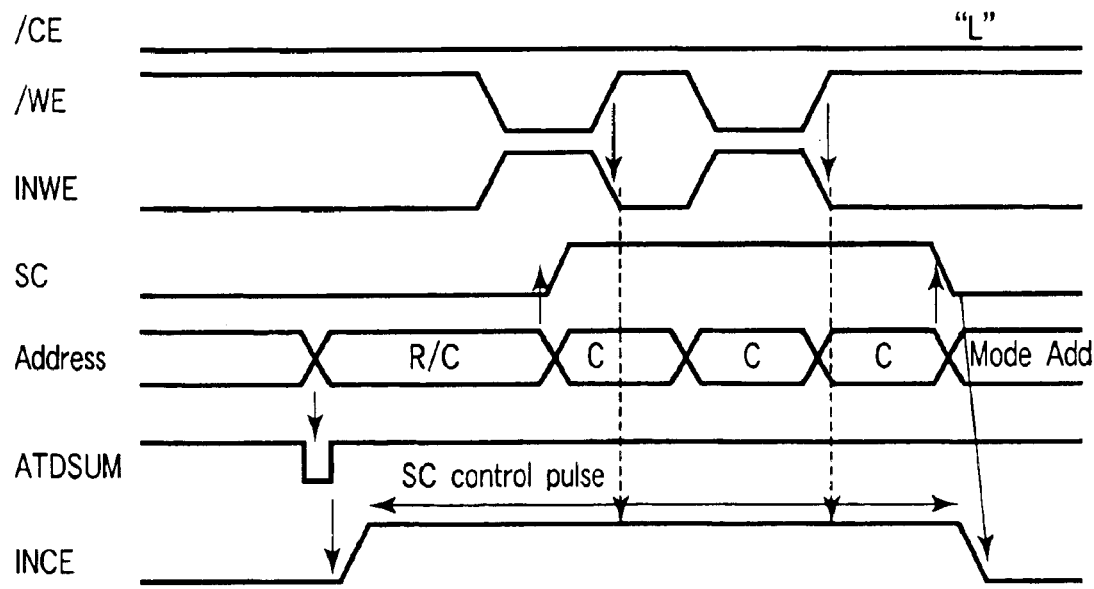
FIG. 11B is a timing chart showing a static column write operation so as to explain the write operation of the internal CE control circuit shown in FIG. 9.

FIGS. 11A and 11B are timing charts showing the write operations of the circuit shown in FIG. 9. In the normal write operation, as shown in the timing chart of FIG. 11A, when the transition of an address signal is detected by the row/column system ATD 11, and the AND signal ATDSUM changes to "L" level, the output signal P1 from the inverter 30 changes to "H" level. The internal chip enable signal INCE output from the NAND circuit 36 changes to "H" level. The output signal P1 from the inverter 30 is delayed by the delay circuit 34 and supplied to the first input terminal of the NAND circuit 35. At this time, the mode determination signal SC output from the mode determination circuit 26 is at "L" level. When the external write enable signal /WE changes to "L" level to start the write operation within the delay time of the delay circuit 34, the internal write enable signal INWE output from the internal WE control circuit 6 changes to "H" level. Hence, the output signal P5 from the inverter 31 is at "H" level. The output signal P3 from the inverter 32 is at "L" level. The output signal from the NAND circuit 35 changes to "L" level. The output signal P4 from the inverter 33 changes to "H" level. As a result, the internal chip enable signal INCE output from the NAND circuit 36 changes to "L" level independently of the delay time.

That is, the internal CE control circuit 1 serves as a pulse generator which generates the pulse signal INCE that is set at "H" level during the period after the AND signal ATDSUM changes to "L" level until the internal write enable signal INWE changes to "L" level.

To the contrary, in the static column write operation shown in FIG. 11B, when the AND signal ATDSUM output from the row/column system ATD 11 changes to "L" level upon detecting the address transition, the output signal P1 from the inverter 30 changes to "H" level. The internal chip enable signal INCE output from the NAND circuit 36 changes to "H" level. The output signal P1 from the inverter 30 is delayed by the delay circuit 34 and supplied to the first input terminal of the NAND circuit 35. At this time, both the mode determination signal SC output from the mode determination circuit 26 and the internal write enable signal INWE output from the internal WE control circuit 6 are at "L" level. For this reason, the output signals P5 and P3 from the inverters 31 and 32 are at "H" level. The output signal from the NAND circuit 35 changes to "L" level. The output signal P4 from the inverter 33 changes to "H" level. Hence, the internal chip enable signal INCE output from the NAND circuit 36 is at "H" level.

When the mode determination signal SC changes to "H" level within the delay time of the delay circuit 34, the static column write operation starts. The internal write enable signal INWE changes to "H" level. The output signal INCE from the internal CE control circuit 1 continuously maintains "H" level, independently of the delay time of the delay circuit 34, during the period until the mode determination signal SC changes to "H" level. Hence, the internal CE control circuit 1 serves as a pulse generator which generates a pulse signal (Ext. pulse) that maintains "H" level after the AND signal ATDSUM changes to "L" level until the mode determination signal SC changes to "L" level, as in the normal read operation.

Even when cycle operation is started upon detecting not the address transition but the transition of the external write enable signal /WE, the same operation as described above can be executed by the AND signal ATDSUM output from the row/column system ATD 11. That is, the internal chip enable signal INCE in the write operation is controlled not by the internal timeout time but by the external write enable signal /WE.

Figure 12:
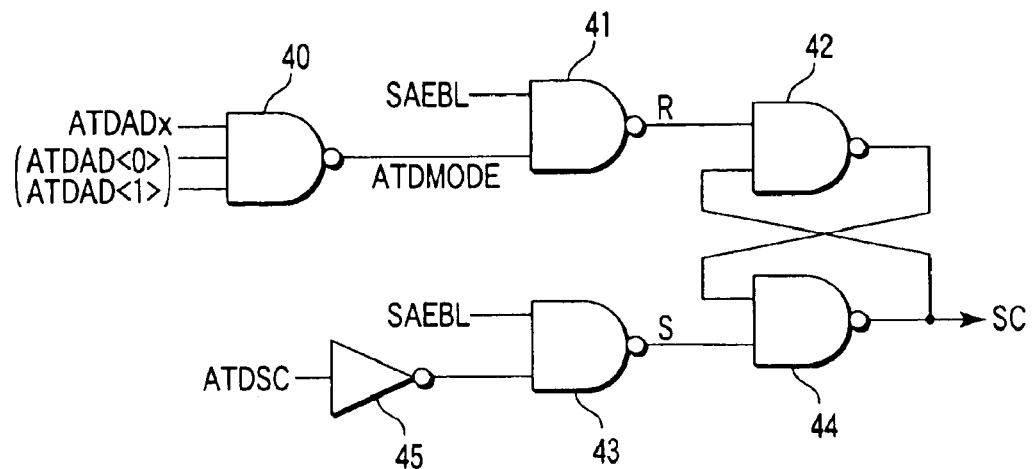
FIG. 12 is a circuit diagram showing the detailed arrangement of a mode determination circuit so as to explain the operation of the semiconductor integrated circuit device shown in FIGS. 5, 6, and 7A.
Figure 13:
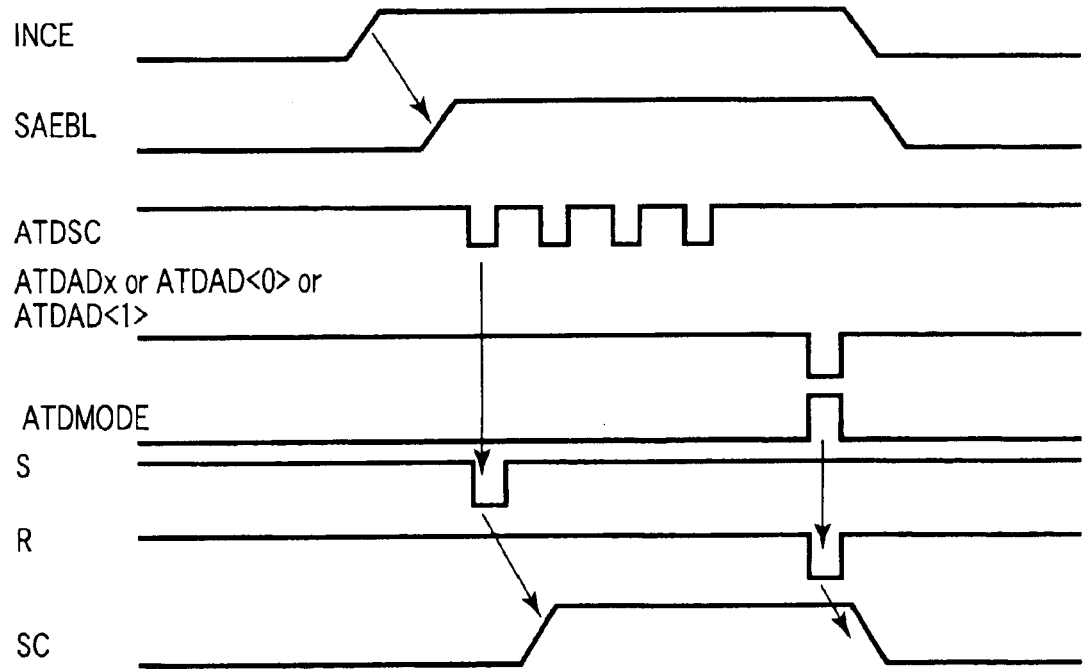
FIG. 13 is a timing chart showing the operation of the mode determination circuit shown in FIG. 12.

FIG. 12 shows the detailed arrangement of the mode determination circuit 26 in the circuit shown in FIGS. 5 and 6. The mode determination circuit 26 includes NAND circuits 40 to 44 and an inverter 45. The signal ATDADx of a row address and page addresses ATDAD<0> and ATDAD<1> are input to the NAND circuit 40. An output signal ATDMODE from the NAND circuit 40 is input to one input terminal of the NAND circuit 41. The sense amplifier enable signal SAEBL that is time-serially generated by the internal CE control circuit 1 is supplied to the other input terminal of the NAND circuit 41. The output signal (reset signal R) from the NAND circuit 41 is input to one input terminal of the NAND circuit 42.

The ATD signal ATDSC of a column address output from the column system ATD 10 is supplied to the inverter 45. The output signal from the inverter 45 is supplied to one input terminal of the NAND circuit 43. The sense amplifier enable signal SAEBL is supplied to the other input terminal of the NAND circuit 43. The output signal (set signal S) from the NAND circuit 43 is supplied to one input terminal of the NAND circuit 44.

The output signal from the NAND circuit 42 is supplied to the other input terminal of the NAND circuit 44. The output signal from the NAND circuit 44 is supplied to the other input terminal of the NAND circuit 42. The mode determination signal SC is output from the NAND circuit 44.

The mode determination circuit 26 is an R-S flip-flop circuit which uses the output from the NAND circuit 41 as the reset signal R and the output from the NAND circuit 43 as the set signal S. A column address transition after the sense amplifier enable signal SAEBL is activated is detected (set). The mode determination signal (column access determination signal) SC is changed to "H" level to start the column access mode. When a mode address (row address) is input next to consecutive column addresses, the mode determination signal SC is set at "L" level. It is determined that the column access mode is ended (reset), and the standby operation is started.

As the mode address, a row address is generally used. However, for example, a page address (A0/A1) used in a pseudo SRAM having a page mode may be used. Alternatively, a certain address may be defined as the mode address in advance and used.

When a certain address or page address is defined as the mode address of the end of column access in advance, the standby operation starts in accordance with the transition of the address. For this reason, it can be defined that the next cycle starts from the next transition of a row address or column address. Hence, the access time has no delay.

According to the specifications of this time, after the mode address defined as the column access end command is input, the standby operation is executed, and the start address of the next cycle is then input.

Figure 14A:
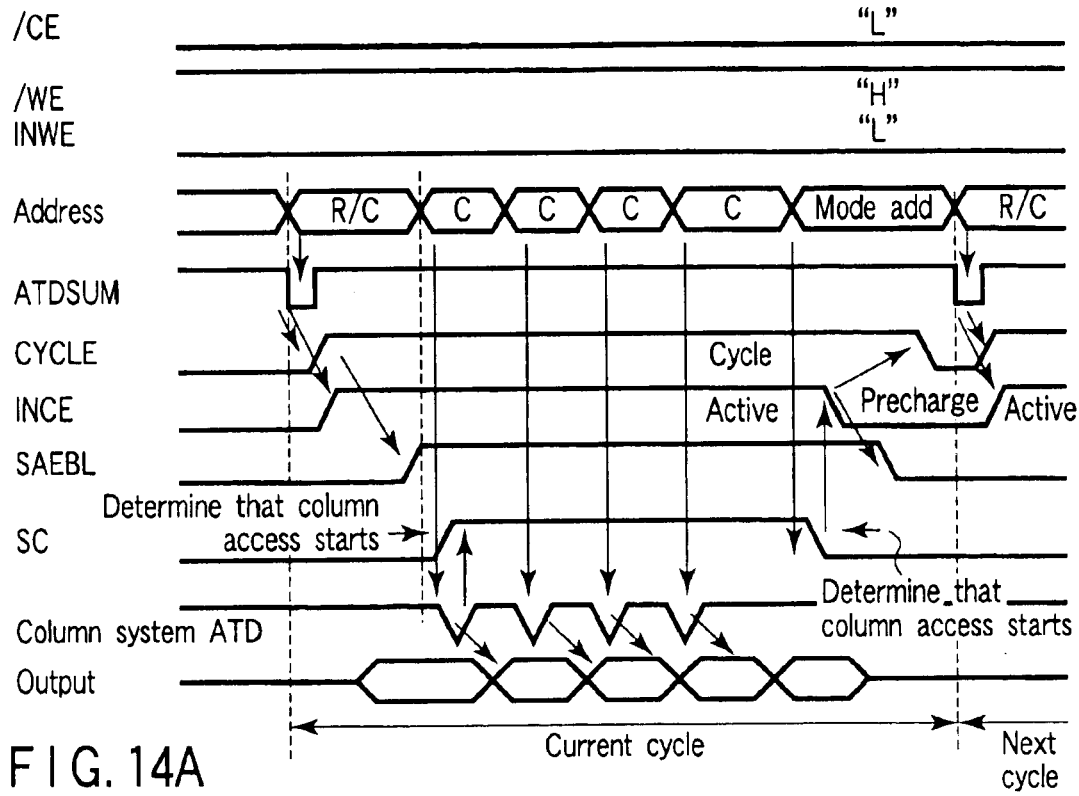
FIG. 14A is a timing chart showing a static column read operation so as to explain the operation of the semiconductor integrated circuit device shown in FIGS. 5, 6, and 7A.
Figure 14B:
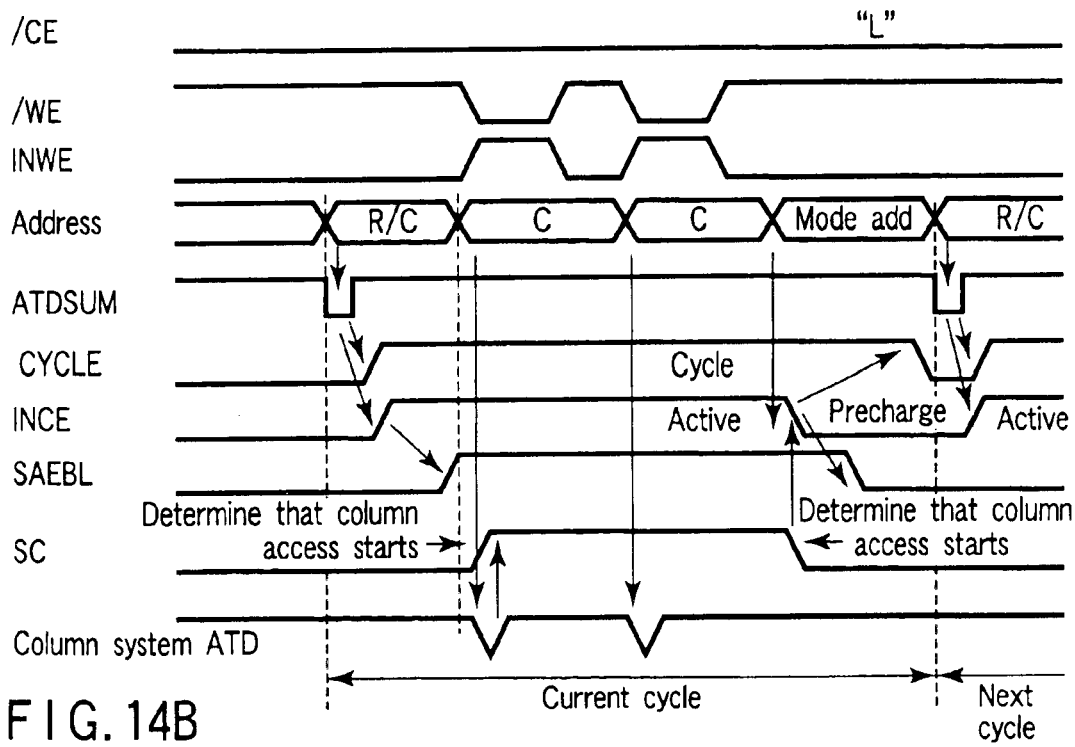
FIG. 14B is a timing chart showing a static column write operation so as to explain the operation of the semiconductor integrated circuit device shown in FIGS. 5, 6, and 7A.

As shown in FIGS. 14A and 14B, in the specifications in which a row address is used as the mode address, after the row address (mode address) is input as the column access end command, the standby operation is executed, and the start address (row or column) of the next cycle is then input, as in the case wherein a predetermined address is used as the mode address. However, even when the start address of the next cycle is a row address, the transition of the row address must occur twice.

Figure 15A:
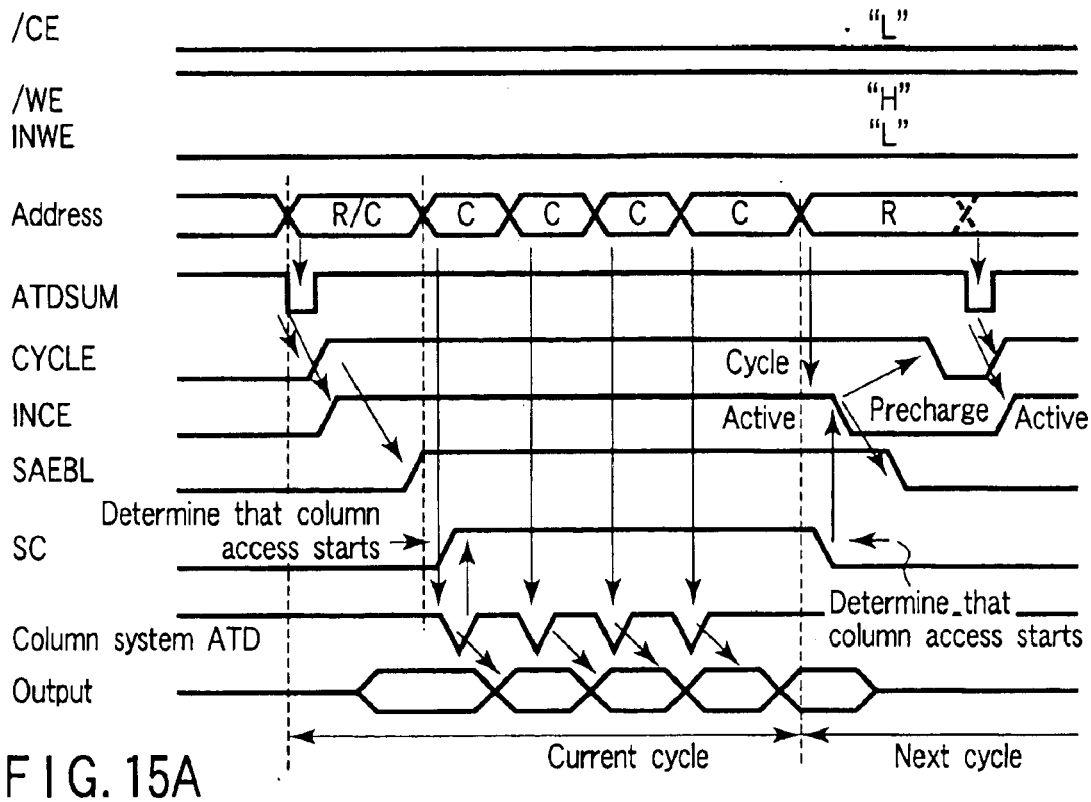
FIG. 15A is a timing chart showing a static column read operation so as to explain another operation of the semiconductor integrated circuit device shown in FIGS. 5, 6, and 7A.
Figure 15B:
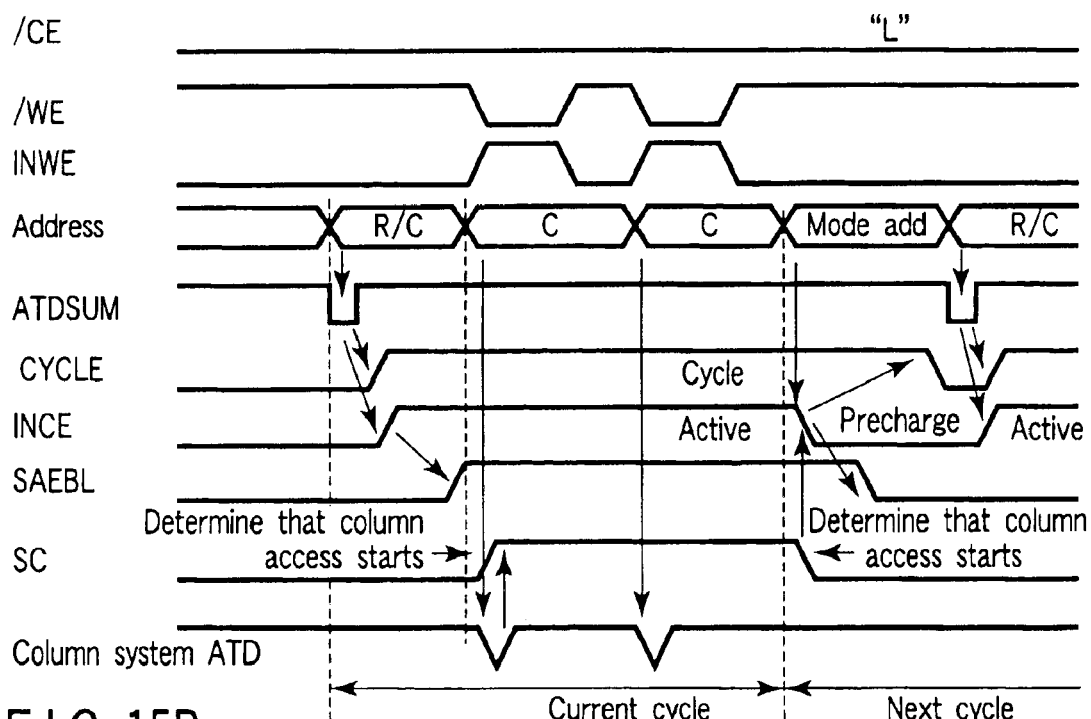
FIG. 15B is a timing chart showing a static column write operation so as to explain another operation of the semiconductor integrated circuit device shown in FIGS. 5, 6, and 7A.

As a modification to the above-described first embodiment, a row address may be input as the column access end command and the start address of the next cycle, as shown in FIGS. 15A and 15B. In this case, the next normal operation is generally defined as the start of the next cycle from the row address transition time. Since the active operation of the next cycle is being executed after the standby operation of the preceding cycle as the actual internal operation, the access time is delayed. However, it poses no problem because column access and row access are rarely mixed.

In this case, normally, the start address of the next cycle equals the mode address, and the start trigger of the next cycle is not generated. To cope with this situation, if no address transition is detected within a predetermined period after the end of a precharge cycle (with constant time), it is regarded that the transition of the same address as the mode address has occurred. The pulse ATDSUM is automatically generated to start the next active cycle.

For example, as shown in FIGS. 15A and 15B, when the control signal CYCLE that defines the cycle changes to "L" level, and the preceding cycle is ended, a trigger according to the transition of the mode address is delayed by the trigger delay ON/OFF circuit 24 shown in FIG. 6, and a pulse is generated.

According to this arrangement, since "mode address=start address of next cycle", the address transition need not be executed twice. However, there still exists the restriction in which the transition of the row address must occur to end column access. If the next cycle should be started in accordance with the transition of a column address, the transition of the mode address (row address) is executed first. After the standby operation, the transition of the column address must be executed.

Especially, in the specifications compatible to the SRAM, the cycle time is regarded as important. The access time can be delayed. As for the cycle time, the precharge cycle is executed first, and then, the active cycle is executed. With this definition, time is not wasted in terms of specifications.

When the above-described arrangement is employed, the high-speed operation mode can reliably be executed in the asynchronous pseudo SRAM without adding any new control pins.

[Second Embodiment]

Figure 17:
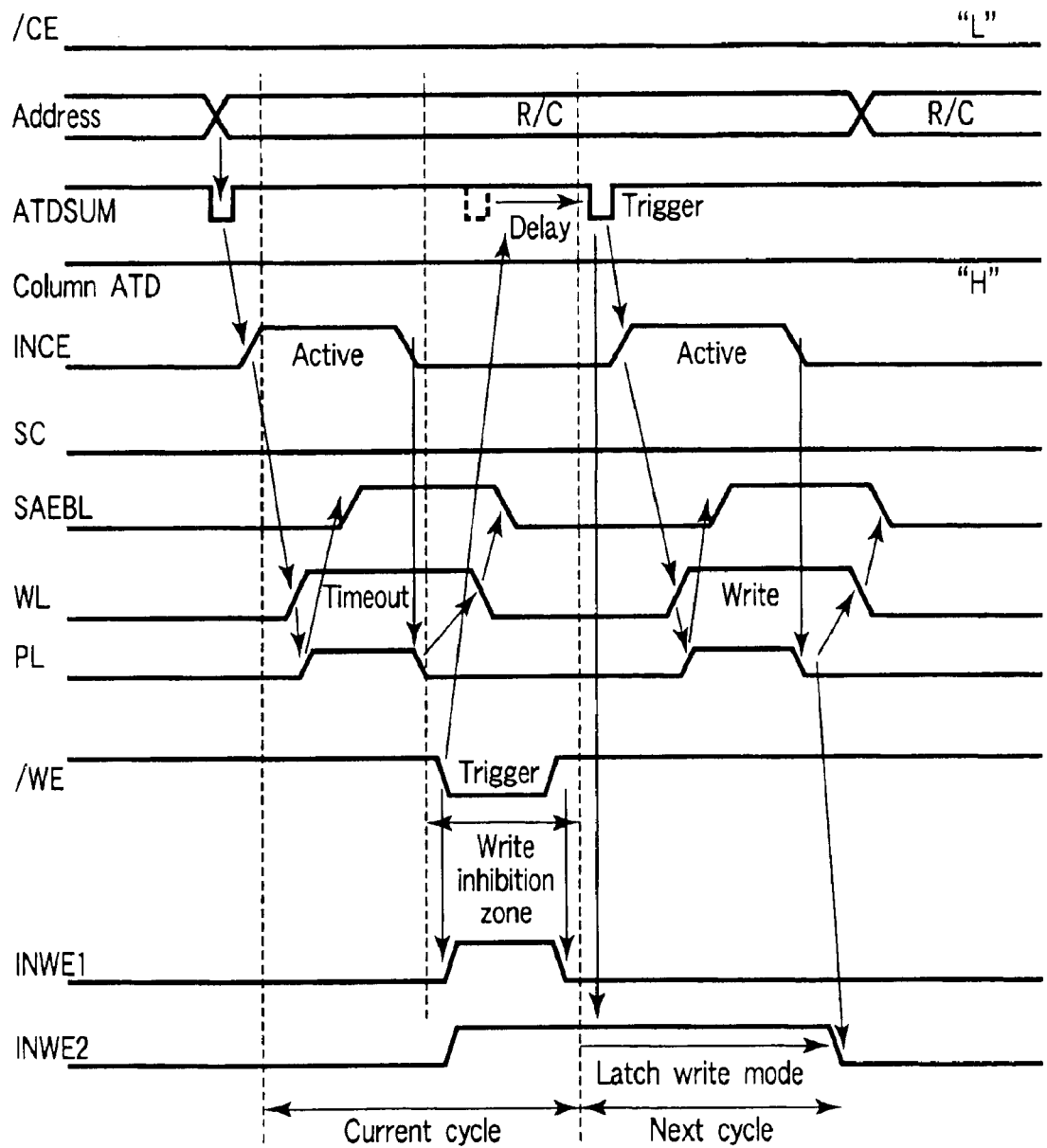
FIG. 17 is a timing chart showing the delayed normal write operation of the pseudo SRAM shown in FIG. 16 so as to explain the semiconductor integrated circuit device according to the second embodiment of the present invention.
Figure 18:
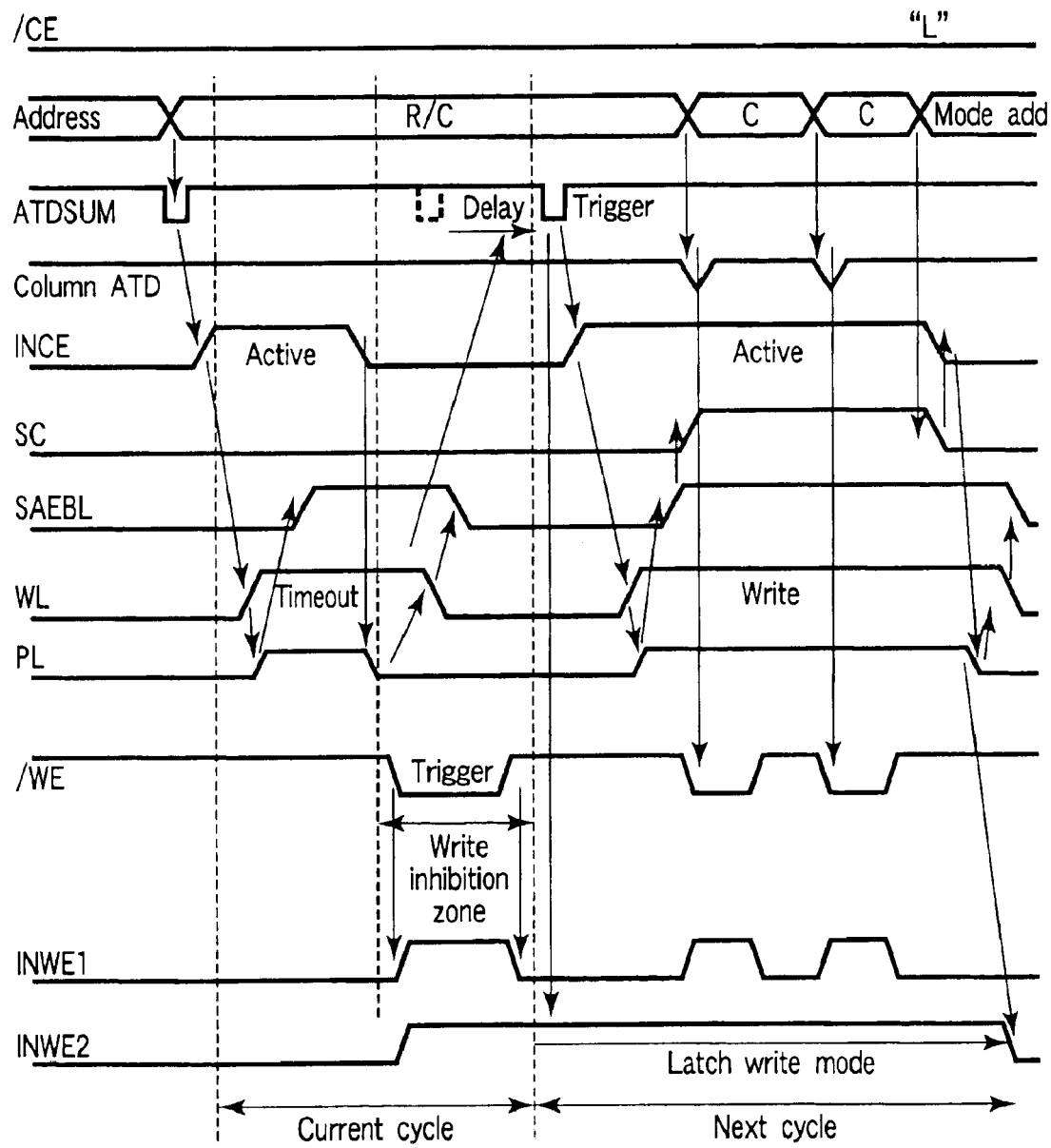
FIG. 18 is a timing chart showing the delayed static column write operation of the pseudo SRAM shown in FIG. 16 so as to explain the semiconductor integrated circuit device according to the second embodiment of the present invention.

FIGS. 16 to 18 are views for explaining a semiconductor integrated circuit device according to the second embodiment of the present invention. FIG. 16 is a block diagram showing the detailed arrangement of a main part related to the read and write of a pseudo SRAM. FIGS. 17 and 18 are timing charts showing the operations of the pseudo SRAM. FIG. 17 shows the delayed normal write operation of the pseudo SRAM shown in FIG. 16. FIG. 18 shows the delayed static column write operation of the pseudo SRAM shown in FIG. 16.

In the second embodiment of the present invention, as shown in FIG. 16, column access can be executed for an arrangement that includes the circuits according to the first embodiment shown in FIG. 6 and is also capable of coping with a delayed input of a write instruction.

More specifically, a trigger delay ON/OFF circuit 28 is inserted between an AND circuit 4 and an ATD (transition detection circuit) 3d of an external write enable signal /WE. A write mode latch ON/OFF circuit 20 is added to the output terminal of a first internal WE control circuit 6.

The trigger delay ON/OFF circuit 28 is used to receive the transition trigger of the external write enable signal /WE not within the cycle but after the end of the cycle.

The write mode latch ON/OFF circuit 20 is used to write data in a cell not in the current cycle but in the next cycle. An output signal INWE1 from the first internal WE control circuit 6 and an output signal PLCLK from a plate line control circuit 7 are supplied to the write mode latch ON/OFF circuit 20. An output signal INWE2 from a second internal WE control circuit 25 is generated and supplied to a data latch circuit 22. A first internal write enable signal INWE1 is supplied to an input/output system control circuit 17.

When this arrangement is employed, in the delayed normal write operation (the normal write of the delayed write) shown in FIG. 17, the write is detected as a write after the pulse driving of a plate line PL. Trigger generation in response to detection of the transition of the external write enable signal /WE is delayed until the end time of the cycle. On the basis of it, the internal chip enable signals INCE1 and INCE2 can be generated. Accordingly, the transition of the external write enable signal /WE, which has occurred in this cycle, can be detected as if it were the transition in the next cycle. A trigger can be generated in response to this transition, and the next operation cycle can be started.

As write data, data during the cycle must be latched. Latch of write data to a write data latch 18 is executed by the input/output system control circuit 17 which receives the signal INWE1 generated on the basis of the external write enable signal /WE.

The above-described arrangement and operations will be summarized below.

The address transition occurs, and the cycle starts. When the delayed write operation starts, the read operation is executed first. If the external write enable signal /WE changes to "L" level before the precharge of a plate line PL or word line WL starts (within the time defined by the internal timeout circuit), control can be executed by the external write enable signal /WE. However, if the operation is so delayed that the write operation is started after the plate line PL ends pulse driving (after the plate line PL changes from "H" level to "L" level), the write operation to the cell is not executed in this cycle although write data during the cycle is latched. The next cycle is automatically activated, and the write operation to the cell is executed in the next cycle.

When the external write enable signal /WE changes from "L" level to "H" level during the write operation of the internal WE control circuit, the write operation is ended. To prevent this, once the internal circuits start the write operation, the internal write enable signal INWE1 having a predetermined width is generated to hold the write operation for a predetermined time. When the above-described arrangement is employed, the user can freely execute the write operation even in the asynchronous pseudo SRAM.

The column access operation of the device having the above arrangement will be described next with reference to the timing chart shown in FIG. 17.

The operation until the write operation starts is the same as the normal operation. When the delayed write operation starts, the write operation to the cell is not executed in that cycle. The next cycle is automatically activated to start the internal operation cycle. Then, after a sense amplifier enable signal SAEBL is activated, the transition of the column address is detected. A mode determination circuit 26 determines that column access starts. A column access determination signal SC is changed to "H" level to start the column access mode. When a mode address (row address) is input next to consecutive column addresses, the column access determination signal SC is set at "L" level. It is determined that the column access mode is ended, and the standby operation is started.

At this time, the second internal write enable signal INWE of the second internal WE control circuit 25 maintains "H" level to latch the write mode until the column access is ended. Even when the arrangement without any restriction in the write operation is employed, column access can be executed.

[Third Embodiment]

Figure 19:
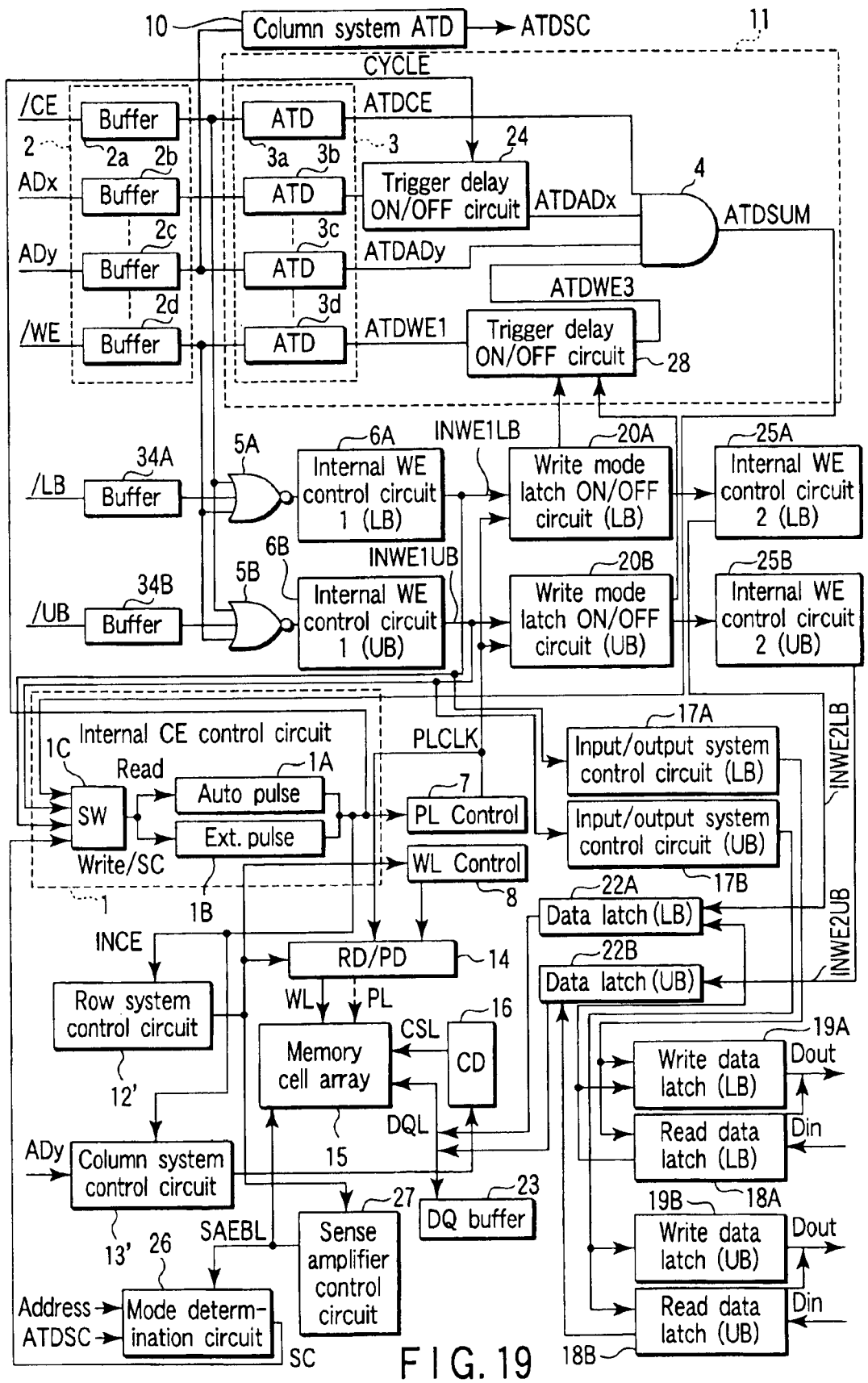
FIG. 19 is a block diagram showing the detailed arrangement of a main part related to the read and write of a pseudo SRAM so as to explain a semiconductor integrated circuit device according to the third embodiment of the present invention.

FIG. 19 is a block diagram for explaining a semiconductor integrated circuit device according to the third embodiment of the present invention. In this embodiment, byte control can be executed. When byte control is executed for, e.g., a 16-bit semiconductor device, the bits are divided into lower 8 bits (LB) and upper 8 bits (UB). A read or write can be executed in a lump for the lower or upper bits. Byte control is used when, for example, a 16-bit structure is to be used as if it were an 8-bit structure, or lower and upper bits should be separately read- or write-accessed.

To implement such byte control, same circuits related to byte control in the above-described second embodiment are prepared as two systems for lower bits (LB) and upper bits (UB).

The same reference numerals as in FIG. 16 denote the same parts in FIG. 19. For circuits for lower bits, "A" is added to the reference numerals used in FIG. 16. For circuits for upper bits, "B" is added to the reference numerals used in FIG. 16.

The operations of the circuits shown in FIG. 19 are basically the same as in the circuits shown in FIG. 16 except that a read or write is executed for the lower or upper bits, and a detailed description thereof will be omitted.

[Fourth Embodiment]

In the semiconductor integrated circuit devices according to the first to third embodiments, pseudo SRAMs have been described, which use, in the memory core portion, an array of ferroelectric cells MC1 each having a 1-transistor/1-capacitor structure and independently connected to the bit line BL and plate line PL. However, the present invention can also be applied to a pseudo SRAM which uses, in the memory core portion, an array in which a unit of TC parallel unit series-connected ferroelectric cells is connected to a bit line BL and plate line PL.

Figure 20A:
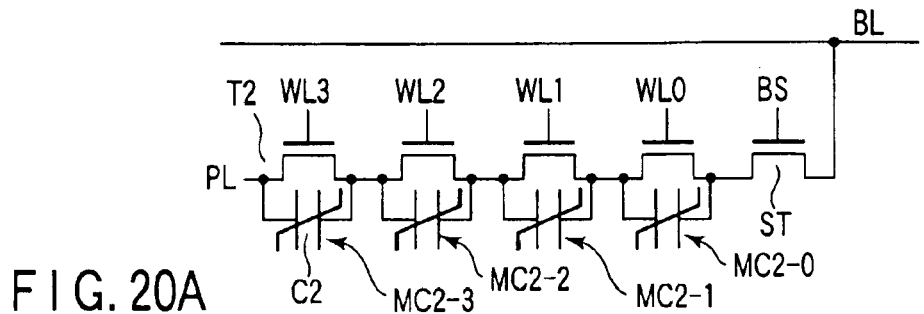
FIG. 20A is an equivalent circuit diagram showing one unit of TC parallel unit series-connected ferroelectric cells so as to explain a semiconductor integrated circuit device according to the fourth embodiment of the present invention.
Figure 20B:
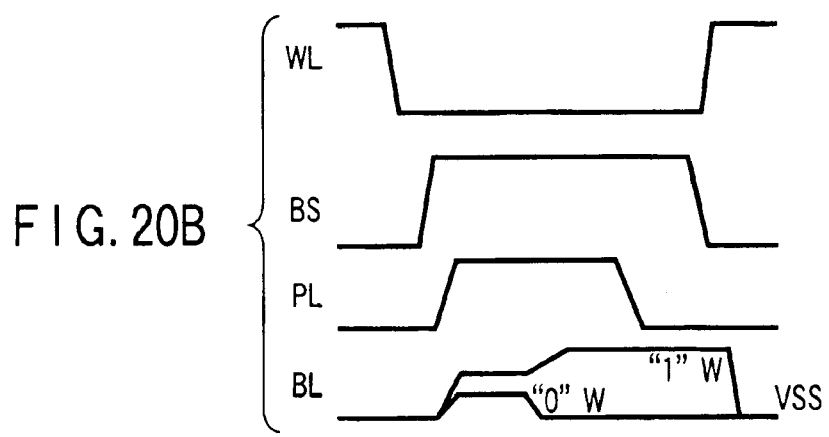
FIG. 20B is a timing chart showing the operation waveforms of the ferroelectric cell shown in FIG. 20A.

FIGS. 20A and 20B are, respectively, an equivalent circuit diagram of one unit of TC parallel unit series-connected ferroelectric cells and its operation waveforms.

In one unit of TC parallel unit series-connected ferroelectric cells shown in FIG. 20A, the current paths between a plurality of (in this example, four) ferroelectric cells MC2-0 to MC2-3 and one unit select transistor ST are connected in series between a bit line BL and a plate line PL. Each of the ferroelectric cells MC2-0 to MC2-3 is constituted by connecting the current path of a cell transistor T2 and a ferroelectric capacitor C2 in parallel. The gates of the cell transistors T2 of the ferroelectric cells MC2-0 to MC2-3 are connected to word lines WL0 to WL3, respectively. The gate of the unit select transistor ST is connected to a unit select line BS.

Of the word lines WL0 to WL3, word lines except ones corresponding to the selected ferroelectric cell are set at "H" level. The cell transistors corresponding to these word lines are controlled to the ON state. Only one word line corresponding to the selected ferroelectric cell is set at "L" level. The cell transistor corresponding to this word line is controlled to the OFF state. One electrode of the cell capacitor of the selected ferroelectric cell is connected to the bit line BL. The other electrode is connected to the plate line PL.

Even with the above-described cell structure, almost the same functions and effects as in the above-described pseudo SRAMs which use, in the memory core portion, ferroelectric cells each having a 1-transistor/1-capacitor structure can basically be obtained.

[Fifth Embodiment]

In the semiconductor integrated circuit devices according to the first to fourth embodiments, pseudo SRAMs have been described, which use, in the memory core portion, the ferroelectric cells MC1 and MC2 each of which pulse-drives the potential of the plate line PL, as shown in FIGS. 7A and 20A.

In the fifth embodiment, DRAM cells each having a 1-transistor/1-capacitor structure are used in the memory core portion.

Figures 21A, 21B:
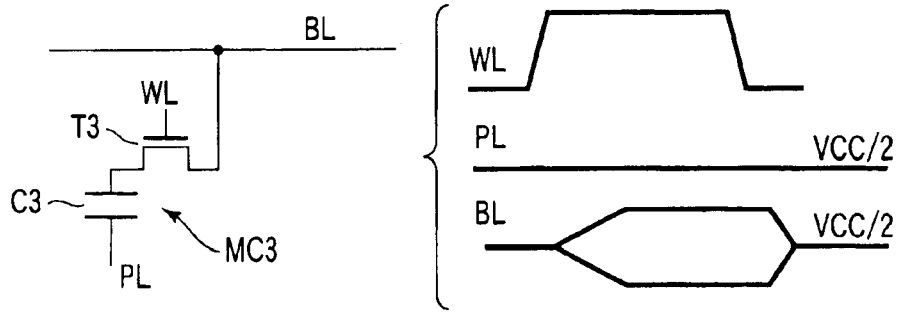
FIG. 21A is an equivalent circuit diagram showing a DRAM cell so as to explain a semiconductor integrated circuit device according to the fifth embodiment of the present invention.
FIG. 21B is a timing chart showing the operation waveforms of the DRAM cell shown in FIG. 21A.

More specifically, DRAM cells MC3 each having a 1-transistor/1-capacitor structure shown in FIG. 21A are arranged in a matrix in a memory cell array 16. One end of the current path of a cell transistor T3 is connected to a bit line BL. The other end is connected to one electrode of a cell capacitor C3. The other electrode of the cell capacitor C3 is connected to a plate line PL.

As shown in FIG. 21B, the precharge voltage of the bit line BL and the potential of the plate line PL are set to ½ a power supply voltage VCC. In this state, a word line WL is selected.

Even with the above-described structure, almost the same functions and effects as in the pseudo SRAMs described in the first to fourth embodiments, which use, in the memory core portion, the ferroelectric cells MC1 or MC2, can basically be obtained.

As described above, the semiconductor integrated circuit device including the pseudo SRAM of each embodiment of the present invention can cope with both the asynchronous operation and the high-speed operation mode such as a static column mode, unlike the prior art. In addition, even in the arrangement without any restriction in the write operation, a high-speed operation mode can be implemented.

Figure 24:
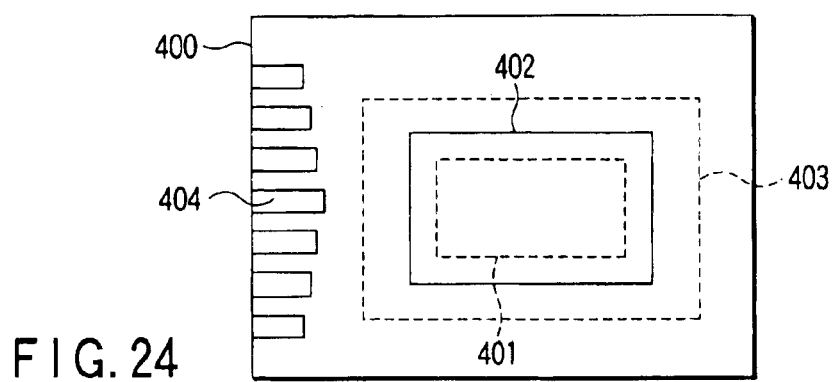
FIG. 24 is a plan view showing an example in which a pseudo SRAM is applied to a card such as a smart medium which stores media contents so as to explain Application Example 3 of the semiconductor integrated circuit devices (pseudo SRAMs) according to the first to fourth embodiments of the present invention.

The semiconductor integrated circuit devices according to the above-described first to fifth embodiments of the present invention can be applied to various apparatuses in place of existing SRAMs. Especially, the semiconductor integrated circuit devices according to the first to fourth embodiments use a ferroelectric memory in the memory core portion and can be applied to, e.g., optional memories of various types or cards which store media contents by using nonvolatility. FIGS. 22 to 24 show application examples.

(Application Example 1)

FIG. 22 shows the DSL (Digital Subscriber Line) data path portion of a DSL modem. This modem includes a programmable digital signal processor (DSP) 110, analog/digital (A/D) converter 120, digital/analog (D/A) converter 130, transmission driver 150, and receiver amplifier 160. FIG. 22 does not illustrate a bandpass filter. Instead, a pseudo SRAM 170 according to one of the embodiments and an EEPROM 180 are illustrated as optional memories of various types to hold a line code program (a program which is executed by the DSP to select and operate a modem in accordance with encoded subscriber line information and transmission conditions (line code; QAM, CAP, RSK, FM, AM, PAM, DWMT, and the like)).

In Application Example 1, two kinds of memories, i.e., the pseudo SRAM 170 and EEPROM 180 are used as memories to hold the line code program. The EEPROM 180 may be replaced with a pseudo SRAM. That is, instead of using two types of memories, only pseudo SRAMs may be used.

(Application Example 2)

FIG. 23 shows a cellular phone terminal 300 as another application example. A communication section 200 which implements a communication function comprises a transmitting/receiving antenna 201, an antenna shared section 202, a receiver section 203, a baseband processing section 204, a DSP 205 used as a voice codec, a loudspeaker (receiver) 206, a microphone (transmitter) 207, a transmitter section 208, and a frequency synthesizer 209.

The cellular phone terminal 300 has a control section 220 which controls the sections of the cellular phone terminal. The control section 220 is a microcomputer which is formed by connecting a CPU 221, a ROM 222, a pseudo SRAM 223 according to one of the embodiments, and a flash memory 224 through a CPU bus 225. The ROM 222 stores, in advance, a program to be executed by the CPU 221 and necessary data such as fonts to be displayed. The pseudo SRAM 223 is mainly used as a work area where the CPU 221 stores, as needed, data midway through calculation during executing the program, or data exchanged between the control section 220 and the respective sections are temporarily stored. Even when the cellular phone terminal 300 is powered off, the flash memory 224 stores, e.g., the immediately preceding set conditions, so the same set conditions can be used when the cellular phone terminal is powered on again. Accordingly, even when the cellular phone terminal is powered off, the stored set parameters are not erased.

The cellular phone terminal 300 also has an audio reproduction processing section 211, an external output terminal 212, an LCD (Liquid Crystal Display) controller 213, an LCD 214 for display, and a ringer 215 which generates a ringing signal. The audio reproduction processing section 211 reproduces audio information input to the cellular phone terminal 300 (or audio information stored in an external memory 240 (to be described later)). The audio information that is reproduced can be transmitted to a headphone or a portable loudspeaker through the external output terminal 212 and extracted to the outside. When the audio reproduction processing section 211 is prepared, audio information can be reproduced. The LCD controller 213 receives display information from, e.g., the CPU 221 through the CPU bus 225, converts the display information into LCD control information to control the LCD 214, and drives the LCD 214 to cause it to perform display.

The cellular phone terminal 300 also has interface circuits (I/Fs) 231, 233, and 235, the external memory 240, an external memory slot 232, a key operation section 234, and an external input/output terminal 236. The external memory slot 232 receives the external memory 240 such as a memory card. The external memory slot 232 is connected to the CPU bus 225 through the interface circuit (I/F) 231. As described above, when the slot 232 is prepared in the cellular phone terminal 300, information in the cellular phone terminal 300 can be written in the external memory 240. Alternatively, information (e.g., audio information) stored in the external memory 240 can be input to the cellular phone terminal 300. The key operation section 234 is connected to the CPU bus 225 through the interface circuit (I/F) 233. Key input information input from the key operation section 234 is transmitted to, e.g., the CPU 221. The external input/output terminal 236 is connected to the CPU bus 225 through the interface circuit (I/F) 233 and functions as a terminal in inputting various kinds of external information to the cellular phone terminal 300 or outputting information externally from the cellular phone terminal 300.

In Application Example 2, the ROM 222, pseudo SRAM 223, and flash memory 224 are used. Since the flash memory 224 is nonvolatile, it may be replaced with a pseudo SRAM. The ROM 222 may also be replaced with a pseudo SRAM.
(Application Example 3)

FIG. 24 shows an example in which a pseudo SRAM is applied to a card as a smart medium which stores media contents.

A card main body 400 incorporates a pseudo SRAM chip 401. An opening portion 402 is formed in the card main body 400 at a position corresponding to the pseudo SRAM chip 401 so the pseudo SRAM chip 401 is exposed. The opening portion 402 has a shutter 403. When the card is carried, the pseudo SRAM chip 401 is protected by the shutter 403. When data is to be written, the shutter 403 is opened to expose the pseudo SRAM chip 401. An external terminal 404 is used to extract content data stored in the card. If the number of external terminals 404 is not limited, data may be written through only the external terminals 404 without forming the opening portion 402 at the position corresponding to the pseudo SRAM chip 401.

According to the arrangements of Application Examples 1 to 3, the advantages of the pseudo SRAM, i.e., no limit on address input, low power consumption, an asynchronous operation for an external input signal, a relatively high operation speed, and nonvolatility can be effectively used.

A pseudo SRAM has been exemplified above as a semiconductor integrated circuit device. However, the present invention can also be applied to a semiconductor integrated circuit device in which a pseudo SRAM and logic circuit are embedded, or a semiconductor integrated circuit device called a SOC in which a system is mounted in one chip.

As described above, according to one aspect of this invention, a semiconductor integrated circuit device which can flexibly execute both an asynchronous operation and a high-speed operation mode without being limited by the cycle time in a predetermined range can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    a memory cell array;
    a chip enable transition detection circuit which detects transition of a chip enable signal that indicates a start of an operation of the memory cell array;
    a first address transition detection circuit which detects transition of a row address signal that indicates a row address of the memory cell array and transition of a column address signal that indicates a column address;
    a write enable transition detection circuit which detects transition of a write enable signal that indicates a write operation of the memory cell array;
    a first control circuit comprising a timeout circuit which generates a control signal that controls row access of the memory cell array on the basis of detection results of the chip enable transition detection circuit, the first address transition detection circuit, and the write enable transition detection circuit;
    a second address transition detection circuit which detects only the transition of the column address signal;
    a second control circuit which controls column access of the memory cell array on the basis of a detection result of the second address transition detection circuit; and
    a mode determination circuit which determines a start of a mode in which column access is executed and generates a mode determination signal when a condition that allows a start of a column access operation of the memory cell array is satisfied, and the second address transition detection circuit detects the transition of the column address, or determines an end of column access and sets a standby state when column access starts, and transition of a predetermined address or a row address is detected,
    wherein when the mode determination circuit determines row access, the access operation of the memory cell array is controlled by the timeout circuit in the first control circuit in read and write operations for the memory cell array, and
    when the mode determination circuit determines column access, an active operation is continued while stopping control by the timeout circuit until column access is ended in the read and write operations for the memory cell array.

2. The device according to claim 1, wherein the column access operation of the memory cell array is started after a start of a sense operation for the memory cell array, and determination is executed by the mode determination circuit on the basis of a sense amplifier enable signal output from a sense amplifier control circuit controlled by the first control circuit.

3. The device according to claim 1, which further comprises a latch circuit which, when the start of the write operation for the memory cell array is instructed after a start of a precharge operation of a word line or a plate line in a period in which the write operation is inhibited, latches write data externally input during the period in which the write operation is inhibited,
    a first circuit to prolong a write mode until the write operation is enabled in a next cycle, and
    a second circuit which waits for an end of the cycle and automatically starts the next cycle, and
    in which the data latched by the latch circuit during the period in which the write operation is inhibited is written in a memory cell when the write operation is enabled in the next cycle, and
    when the mode determination circuit determines in the next cycle the mode in which column access is executed, an active operation is continued until column access is ended.

4. The device according to claim 1, which further comprises a first latch circuit for lower bits, which, when the start of the write operation for the memory cell array is instructed after a start of a precharge operation of a word line or a plate line in a period in which the write operation is inhibited, latches write data externally input during the period in which the write operation is inhibited,
    a second latch circuit for upper bits, which, when the start of the write operation for the memory cell array is instructed after the start of the precharge operation of the word line or the plate line in the period in which the write operation is inhibited, latches write data externally input during the period in which the write operation is inhibited, a first circuit for the lower bits to prolong a write mode until the write operation is enabled in a next cycle, a second circuit for the upper bits to prolong the write mode until the write operation is enabled in the next cycle, a third circuit for the low bits, which waits for an end of the cycle and automatically starts the next cycle, and a fourth circuit for the upper bits, which waits for the end of the cycle and automatically starts the next cycle, and in which the data latched by one of the first and second latch circuits during the period in which the write operation is inhibited is written in a memory cell when the write operation is enabled in the next cycle, and when the mode determination circuit determines in the next cycle the mode in which column access is executed, an active operation is continued until column access is ended.

5. The device according to claim 1, further comprising a fifth circuit which uses a row address for determination of an end of column access, and when the row address signal in a next cycle has no change, waits for an end of the cycle by the timeout circuit which generates the control signal that controls row access of the memory cell array and automatically starts the next cycle.

6. The device according to claim 1, wherein the memory cell array is formed by arraying ferroelectric cells in a matrix.

7. The device according to claim 1, wherein the memory cell array is formed by arraying TC parallel unit series-connected ferroelectric cells in a matrix.

8. The device according to claim 1, wherein the memory cell array is formed by arraying dynamic cells in a matrix.

9. A semiconductor integrated circuit device comprising:

a memory cell array;

a chip enable transition detection circuit which detects transition of a chip enable signal that indicates a start of an operation of the memory cell array;

a first address transition detection circuit which detects transition of a row address signal that indicates a row address of the memory cell array and transition of a column address signal that indicates a column address;

a write enable transition detection circuit which detects transition of a write enable signal that indicates a write operation of the memory cell array;

a first control circuit comprising a timeout circuit which generates a control signal that controls row access of the memory cell array on the basis of detection results of the chip enable transition detection circuit, the first address transition detection circuit, and the write enable transition detection circuit;

a second address transition detection circuit which detects only the transition of the column address signal;

a second control circuit which controls column access of the memory cell array on the basis of a detection result of the second address transition detection circuit; and a mode determination circuit which determines a start of a mode in which column access is executed and generates a mode determination signal when a condition that allows a start of a column access operation of the memory cell array is satisfied, and the second address transition detection circuit detects the transition of the column address, or determines an end of column access and sets a standby state when column access starts, and transition of a predetermined address or a row address is detected, wherein when the mode determination circuit determines row access, the access operation of the memory cell array is controlled by the timeout circuit in the first control circuit in read and write operations for the memory cell array, in the write operation for the memory cell array, when the write enable transition detection circuit detects the transition of an end of the write enable signal before a period indicated by the timeout circuit, the access operation of the memory cell array is controlled by the timeout circuit, in the write operation for the memory cell array, when the write enable transition detection circuit detects the transition of the end of the write enable signal after the period indicated by the timeout circuit, the access operation of the memory cell array is controlled in response to the transition of the write enable signal, when the mode determination circuit determines column access, an active operation is continued while stopping control by the timeout circuit until column access is ended in the read operation for the memory cell array, and in the write operation for the memory cell array, the active operation is continued while stopping control by the timeout circuit or control that responds to the transition of the write enable signal until column access is ended.

10. The device according to claim 9, wherein the column access operation of the memory cell array is started after a start of a sense operation for the memory cell array, and determination is executed by the mode determination circuit on the basis of a sense amplifier enable signal output from a sense amplifier control circuit controlled by the first control circuit.

11. The device according to claim 9, which further comprises a latch circuit which, when the start of the write operation for the memory cell array is instructed after a start of a precharge operation of a word line or a plate line in a period in which the write operation is inhibited, latches write data externally input during the period in which the write operation is inhibited, a first circuit to prolong a write mode until the write operation is enabled in a next cycle, and a second circuit which waits for an end of the cycle and automatically starts the next cycle, and in which the data latched by the latch circuit during the period in which the write operation is inhibited is written in a memory cell when the write operation is enabled in the next cycle, and when the mode determination circuit determines in the next cycle the mode in which column access is executed, an active operation is continued until column access is ended.

12. The device according to claim 9, which further comprises a first latch circuit for lower bits, which, when the start of the write operation for the memory cell array is instructed after a start of a precharge operation of a word line or a plate line in a period in which the write operation is inhibited, latches write data externally input during the period in which the write operation is inhibited, a second latch circuit for upper bits, which, when the start of the write operation for the memory cell array is instructed after the start of the precharge operation of the word line or the plate line in the period in which the write operation is inhibited, latches write data externally input during the period in which the write operation is inhibited, a first circuit for the lower bits to prolong a write mode until the write operation is enabled in a next cycle, a second circuit for the upper bits to prolong the write mode until the write operation is enabled in the next cycle, a third circuit for the low bits, which waits for an end of the cycle and automatically starts the next cycle, and a fourth circuit for the upper bits, which waits for the end of the cycle and automatically starts the next cycle, and in which the data latched by one of the first and second latch circuits during the period in which the write operation is inhibited is written in a memory cell when the write operation is enabled in the next cycle, and when the mode determination circuit determines in the next cycle the mode in which column access is executed, an active operation is continued until column access is ended.

13. The device according to claim 9, further comprising a fifth circuit which uses a row address for determination of an end of column access, and when the row address signal in a next cycle has no change, waits for an end of the cycle by the timeout circuit which generates the control signal that controls row access of the memory cell array and automatically starts the next cycle.

14. The device according to claim 9, wherein the memory cell array is formed by arraying ferroelectric cells in a matrix.

15. The device according to claim 9, wherein the memory cell array is formed by arraying TC parallel unit series-connected ferroelectric cells in a matrix.

16. The device according to claim 9, wherein the memory cell array is formed by arraying dynamic cells in a matrix.

* * * * *